(12) United States Patent
Seo et al.

(10) Patent No.: US 12,207,506 B2
(45) Date of Patent: Jan. 21, 2025

(54) DISPLAY PANEL HAVING MAIN PIXELS AND AUXILIARY PIXELS AND DISPLAY APPARATUS INCLUDING THE SAME

(71) Applicant: Samsung Display Co., Ltd., Yongin-si (KR)

(72) Inventors: Youngwan Seo, Yongin-si (KR); Gyungsoon Park, Yongin-si (KR); Sujin Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 328 days.

(21) Appl. No.: 17/444,904

(22) Filed: Aug. 11, 2021

(65) Prior Publication Data

US 2022/0102470 A1    Mar. 31, 2022

(30) Foreign Application Priority Data

Sep. 25, 2020   (KR) .......................... 10-2020-0125089

(51) Int. Cl.
   *H10K 59/131*       (2023.01)
   *H01L 27/12*        (2006.01)
   *H10K 59/121*       (2023.01)
   *H10K 59/123*       (2023.01)

(52) U.S. Cl.
   CPC ....... *H10K 59/131* (2023.02); *H10K 59/1213* (2023.02); *H10K 59/123* (2023.02); *H01L 27/124* (2013.01)

(58) Field of Classification Search
   CPC .......................... G09G 3/3233; G09G 3/3225
   See application file for complete search history.

(56) References Cited

U.S. PATENT DOCUMENTS

| 2006/0087603 A1* | 4/2006 | Lee ..................... G02B 5/201 349/109 |
| 2012/0099036 A1* | 4/2012 | Chang .................. G02F 1/161 445/24 |
| 2017/0372661 A1* | 12/2017 | Gu ...................... H10K 59/131 |
| 2019/0121211 A1 | 4/2019 | Luo et al. |

FOREIGN PATENT DOCUMENTS

| CN | 107742502 A | 2/2018 |
| CN | 109270758 A | 1/2019 |
| CN | 110047897 A | 7/2019 |
| CN | 110874990 A | 3/2020 |
| CN | 111063719 A | 4/2020 |
| KR | 10-2018-0000771 A | 1/2018 |

* cited by examiner

*Primary Examiner* — Lauren Nguyen
(74) *Attorney, Agent, or Firm* — Lewis Roca Rothgerber Christie LLP

(57) ABSTRACT

A display panel includes: a substrate including a main display area, a component area, and a peripheral area; a plurality of main subpixels in the main display area; a plurality of auxiliary subpixels in the component area; a first pixel circuit unit and a second pixel circuit unit in the peripheral area and including a plurality of auxiliary pixel circuits; a plurality of main scan lines connected to the plurality of main pixel circuits and extending in a first direction and a plurality of main data lines extending in a second direction intersecting with the first direction; and a plurality of scan connection lines branched from some of the plurality of main scan lines in the second direction and connected to the plurality of auxiliary pixel circuits, wherein the plurality of scan connection lines are in the main display area or between the main display area and the component area.

20 Claims, 15 Drawing Sheets

DISPLAY PANEL HAVING MAIN PIXELS AND AUXILIARY PIXELS AND DISPLAY APPARATUS INCLUDING THE SAME

CROSS-REFERENCE TO RELATED APPLICATION

The present application claims priority to and the benefit of Korean Patent Application No. 10-2020-0125089, filed on Sep. 25, 2020, in the Korean Intellectual Property Office, the entire content of which is hereby incorporated by reference.

BACKGROUND

1. Field

Aspects of one or more embodiments relate to a display panel and a display apparatus including the same.

2. Description of Related Art

Recently, display apparatuses have been used for various purposes. Also, as display apparatuses have become thinner and lighter, their ranges of uses have widened.

As display apparatuses are used in various ways, various methods may be used to design the shapes of display apparatuses, and further, more and more functions may be combined or associated with display apparatuses.

The above information disclosed in this Background section is only for enhancement of understanding of the background and therefore the information discussed in this Background section does not necessarily constitute prior art.

SUMMARY

Aspects of one or more embodiments relate to a display panel and a display apparatus including the same, and for example, to a display panel in which a display area is extended such that an image may be displayed even in an area where a component as an electronic element is arranged and a display apparatus including the display panel.

Aspects of one or more embodiments include a display panel in which a display area is extended such that an image may be displayed even in an area where a component as an electronic element is arranged and a display apparatus including the display panel. However, these characteristics are merely examples and the scope of embodiments according to the present disclosure are not limited thereto.

Additional aspects will be set forth in part in the description which follows and, in part, will be apparent from the description, or may be learned by practice of the presented embodiments.

According to one or more embodiments, a display panel includes a substrate including a main display area, a component area, and a peripheral area, a plurality of main subpixels arranged in the main display area over the substrate and a plurality of main pixel circuits respectively connected to the plurality of main subpixels, a plurality of auxiliary subpixels arranged in the component area over the substrate, a first pixel circuit unit and a second pixel circuit unit arranged in the peripheral area over the substrate and including a plurality of auxiliary pixel circuits, a plurality of main scan lines connected to the plurality of main pixel circuits in the main display area and extending in a first direction and a plurality of main data lines extending in a second direction intersecting with the first direction, and a plurality of scan connection lines branched from some of the plurality of main scan lines in the second direction and connected to the plurality of auxiliary pixel circuits, wherein the plurality of scan connection lines are arranged in the main display area or between the main display area and the component area.

According to some embodiments, among the plurality of scan connection lines, a length of the scan connection line arranged adjacent to the component area may be greatest.

According to some embodiments, among the plurality of scan connection lines, a length of the scan connection line arranged adjacent to the component area may be smallest.

According to some embodiments, the plurality of scan connection lines may be arranged on the same layer as the plurality of main data lines.

According to some embodiments, the display panel may further include a plurality of driving voltage lines connected to the plurality of main pixel circuits in the main display area and extending in a y direction, wherein each of the plurality of scan connection lines may at least partially overlap each of the plurality of driving voltage lines.

According to some embodiments, the plurality of scan connection lines may include a first scan connection line and a second scan connection line arranged on different layers.

According to some embodiments, the first scan connection line may be provided on the same layer as the plurality of main scan lines.

According to some embodiments, the plurality of main scan lines may include a first main scan line and a second main scan line arranged in the same row with the component area therebetween, the first main scan line may be connected to one of the plurality of scan connection lines, and the second main scan line may not be connected to the plurality of scan connection lines.

According to some embodiments, the display panel may further include a plurality of connection lines respectively connecting the plurality of auxiliary subpixels to the plurality of auxiliary pixel circuits, wherein the plurality of connection lines may include a transparent conductive material.

According to some embodiments, the display panel may further include a plurality of additional connection lines connecting the plurality of connection lines to the plurality of auxiliary pixel circuits, wherein the plurality of additional connection lines may include a different material than the plurality of connection lines.

According to one or more embodiments, a display apparatus includes a display panel comprising a main display area including main subpixels, a component area including auxiliary subpixels, and a peripheral area, and a component arranged under the display panel to correspond to the component area, the display panel comprising a substrate, a plurality of main subpixels arranged in the main display area over the substrate and a plurality of main pixel circuits respectively connected to the plurality of main subpixels, a plurality of auxiliary subpixels arranged in the component area over the substrate, a first pixel circuit unit and a second pixel circuit unit arranged in the peripheral area over the substrate and including a plurality of auxiliary pixel circuits, a plurality of main scan lines connected to the plurality of main pixel circuits in the main display area and extending in a first direction and a plurality of main data lines extending in a second direction intersecting with the first direction, and a plurality of scan connection lines branched from some of the plurality of main scan lines in the second direction and connected to the plurality of auxiliary pixel circuits, wherein the plurality of scan connection lines are arranged in the main display area or between the main display area and the component area.

According to some embodiments, among the plurality of scan connection lines, a length of the scan connection line arranged adjacent to the component area may be greatest.

According to some embodiments, among the plurality of scan connection lines, a length of the scan connection line arranged adjacent to the component area may be smallest.

According to some embodiments, the plurality of scan connection lines may be arranged on the same layer as the plurality of main data lines.

According to some embodiments, the display apparatus may further include a plurality of driving voltage lines connected to the plurality of main pixel circuits in the main display area and extending in a y direction, wherein each of the plurality of scan connection lines may at least partially overlap each of the plurality of driving voltage lines.

According to some embodiments, the plurality of scan connection lines may include a first scan connection line and a second scan connection line arranged on different layers.

According to some embodiments, the first scan connection line may be provided on the same layer as the plurality of main scan lines.

According to some embodiments, the plurality of main scan lines may include a first main scan line and a second main scan line arranged in the same row with the component area therebetween, the first main scan line may be connected to one of the plurality of scan connection lines, and the second main scan line may not be connected to the plurality of scan connection lines.

According to some embodiments, the display apparatus may further include a plurality of connection lines respectively connecting the plurality of auxiliary subpixels to the plurality of auxiliary pixel circuits, wherein the plurality of connection lines may include a transparent conductive material.

According to some embodiments, the display apparatus may further include a plurality of additional connection lines connecting the plurality of connection lines to the plurality of auxiliary pixel circuits, wherein the plurality of additional connection lines may include a different material than the plurality of connection lines.

BRIEF DESCRIPTION OF THE DRAWINGS

The above and other aspects, features, and characteristics of certain embodiments will be more apparent from the following description taken in conjunction with the accompanying drawings, in which.

DETAILED DESCRIPTION

Figure 1:
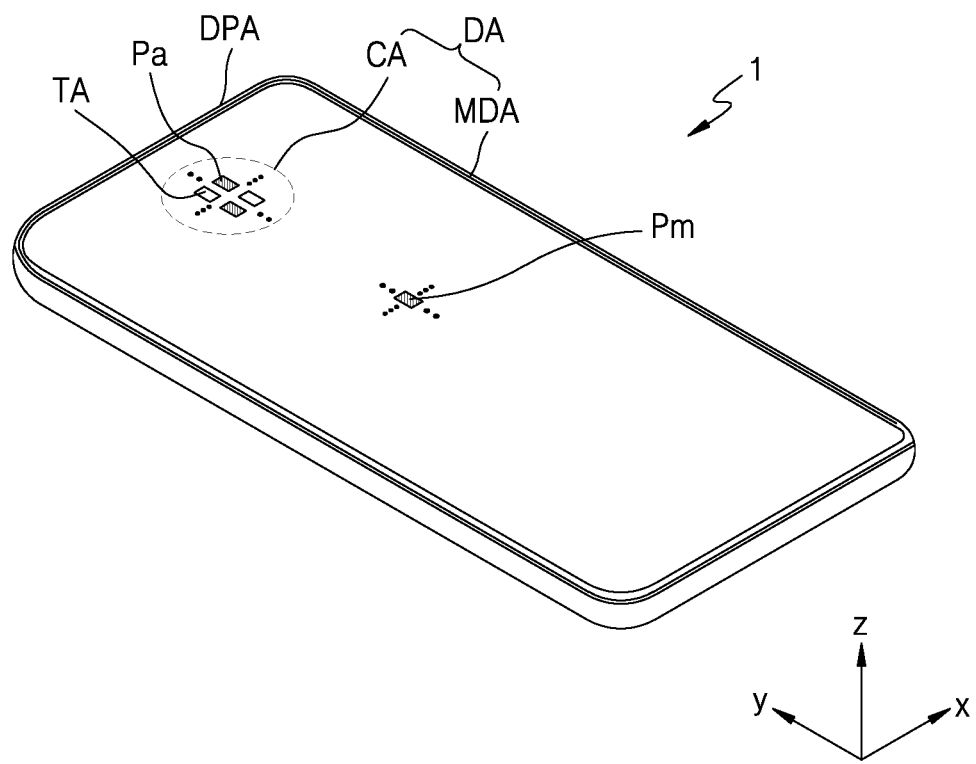
FIG. 1 is a perspective view schematically illustrating a display apparatus according to some embodiments.

Reference will now be made in more detail to aspects of some embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

The disclosure may include various embodiments and modifications, and certain embodiments thereof are illustrated in the drawings and will be described herein in more detail. The effects and features of the disclosure and the accomplishing methods thereof will become apparent from the embodiments described below in more detail with reference to the accompanying drawings. However, embodiments according to the disclosure are not limited to the embodiments described below and may be embodied in various modes.

Hereinafter, aspects of some embodiments will be described in more detail with reference to the accompanying drawings, and in the following description, like reference numerals will denote like elements and redundant descriptions thereof will be omitted for conciseness.

It will be understood that when an element such as a layer, a region, or a plate is referred to as being "on" another element, it may be "directly on" the element or may be "indirectly on" the other element with one or more intervening elements therebetween. Also, sizes of elements in the drawings may be exaggerated for convenience of description. In other words, because the sizes and thicknesses of elements in the drawings are arbitrarily illustrated for convenience of description, embodiments according to the disclosure are not limited thereto.

Also, herein, the x axis, the y axis, and the z axis are not limited to three axes of the rectangular coordinate system and may be interpreted in a broader sense. For example, the x axis, the y axis, and the z axis may be perpendicular to one another or may represent different directions that are not perpendicular to one another.

FIG. 1 is a perspective view schematically illustrating a display apparatus 1 according to some embodiments.

Referring to FIG. 1, the display apparatus 1 may include a display area DA and a peripheral area DPA outside the display area DA. The display area DA may include a component area CA and a main display area MDA at least partially surrounding the component area CA. That is, each of the component area CA and the main display area MDA may display images individually or together. The peripheral area DPA may be a type of non-display area in which display elements are not arranged (e.g., a bezel area). The display area DA may be entirely surrounded by the peripheral area DPA.

FIG. 1 illustrates that one component area CA is located inside the main display area MDA. According to some embodiments, the display apparatus 1 may include two or more component areas CA and the shapes and sizes of component areas CA may be different from each other. That is, the number and shape of the component areas CA may be any suitable number or shape according to the design and use of the display apparatus 1. When viewed in a direction substantially perpendicular to the top surface of the display apparatus 1 (e.g., when viewed in a plan view or a view normal with respect to a plane of the display surface), the component area CA may have various shapes such as circular shapes, elliptical shapes, polygonal shapes such as tetragonal shapes, star shapes, or diamond shapes. Also, FIG. 1 illustrates that the component area CA is arranged at the upper center (in the +y direction) of the main display area MDA having a substantially rectangular shape when viewed in a direction substantially perpendicular to the top surface of the display apparatus 1 (e.g., when viewed in a plan view or a view normal with respect to a plane of the display surface); however, the component area CA may be arranged at one side of the main display area MDA having a rectangular shape, for example, at the upper right side or the upper left side thereof. That is, according to various embodiments and the design of the display apparatus 1, the component area CA may be located in different locations and have different shapes.

The display apparatus 1 may display images by using a plurality of main subpixels Pm arranged in the main display area MDA and a plurality of auxiliary subpixels Pa arranged in the component area CA.

As described below with reference to FIG. 2, in the component area CA, a component 40 as an electronic element may be arranged under a display panel corresponding to the component area CA. The component 40 may include an imaging device as a camera using infrared light or visible light. Alternatively, the component 40 may include a solar cell, a flash, an illuminance sensor, a proximity sensor, or an iris sensor. Alternatively, the component 40 may have a function of receiving sound or other wireless spectrum signals. In order to minimize or reduce the limitation of the function of the component 40, the component area CA may include a transmission area TA that may be configured to transmit light and/or sound output from the component 40 to the outside or propagating toward the component 40 from the outside. In the case of a display panel and a display apparatus including the display panel according to some embodiments, when light is transmitted through the component area CA, the light transmittance thereof may be about 10% or more, for example, about 40% or more, about 25% or more, about 50% or more, about 85% or more, or about 90% or more.

A plurality of auxiliary subpixels Pa may be arranged in the component area CA. The plurality of auxiliary subpixels Pa may display images by emitting light. The images displayed in the component area CA may be auxiliary images which may have a relatively lower resolution than the images displayed in the main display area MDA. That is, the component area CA may include a transmission area TA through which light and sound may be transmitted, and when no subpixel is arranged over the transmission area TA, the number of auxiliary subpixels Pa that may be arranged per unit area therein may be less than the number of main subpixels Pm arranged per unit area in the main display area MDA. Thus, the component area CA may have a relatively lower density of auxiliary pixels Pa compared to the density of main subpixels Pm in the main display area MDA in order to allow for or accommodate a space for one or more transmission areas TA that are interspersed around the auxiliary pixels Pa in the component area CA.

Figure 2A:
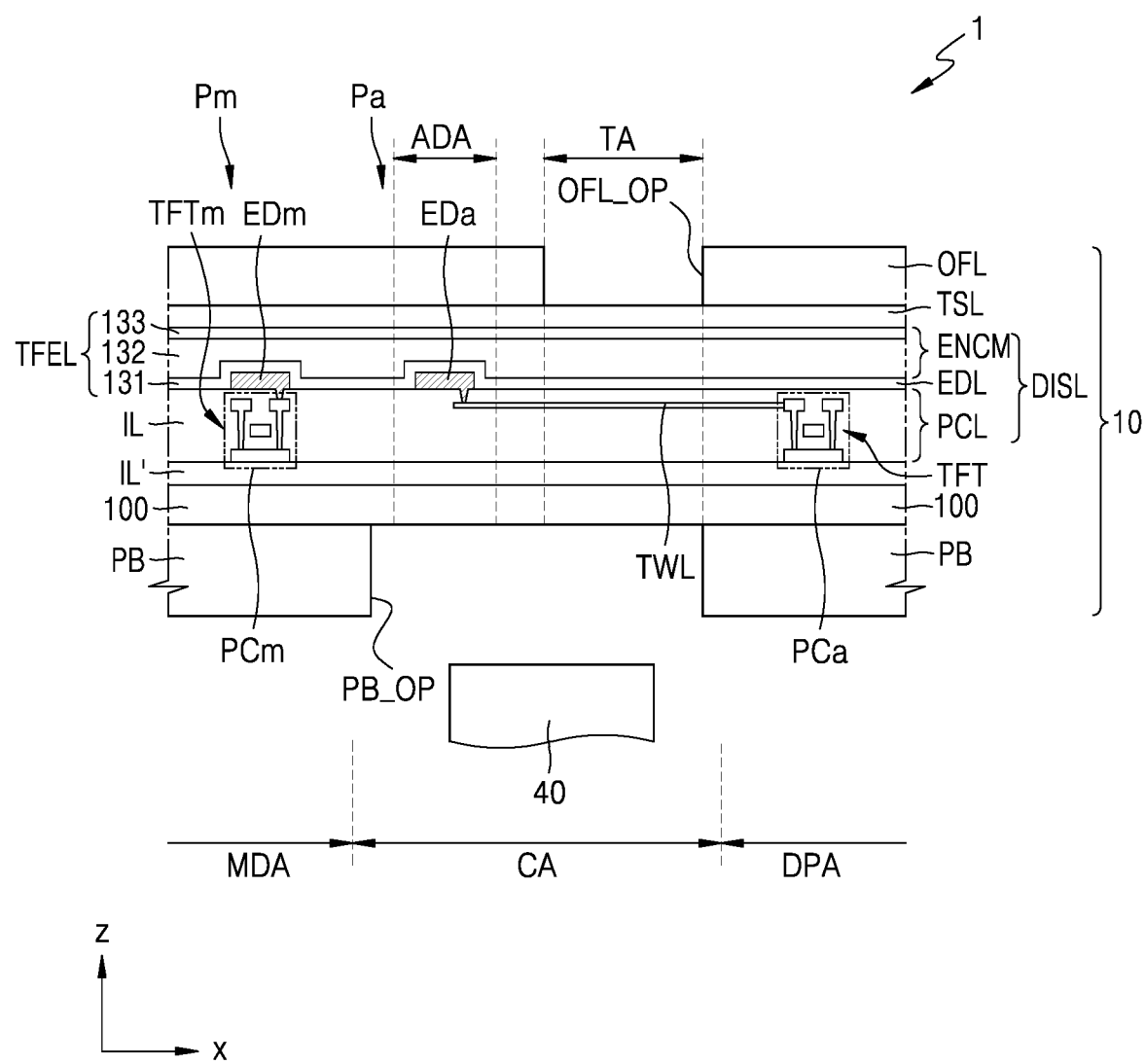
FIG. 2A is a cross-sectional view schematically illustrating a portion of a display apparatus according to some embodiments.
Figure 2B:
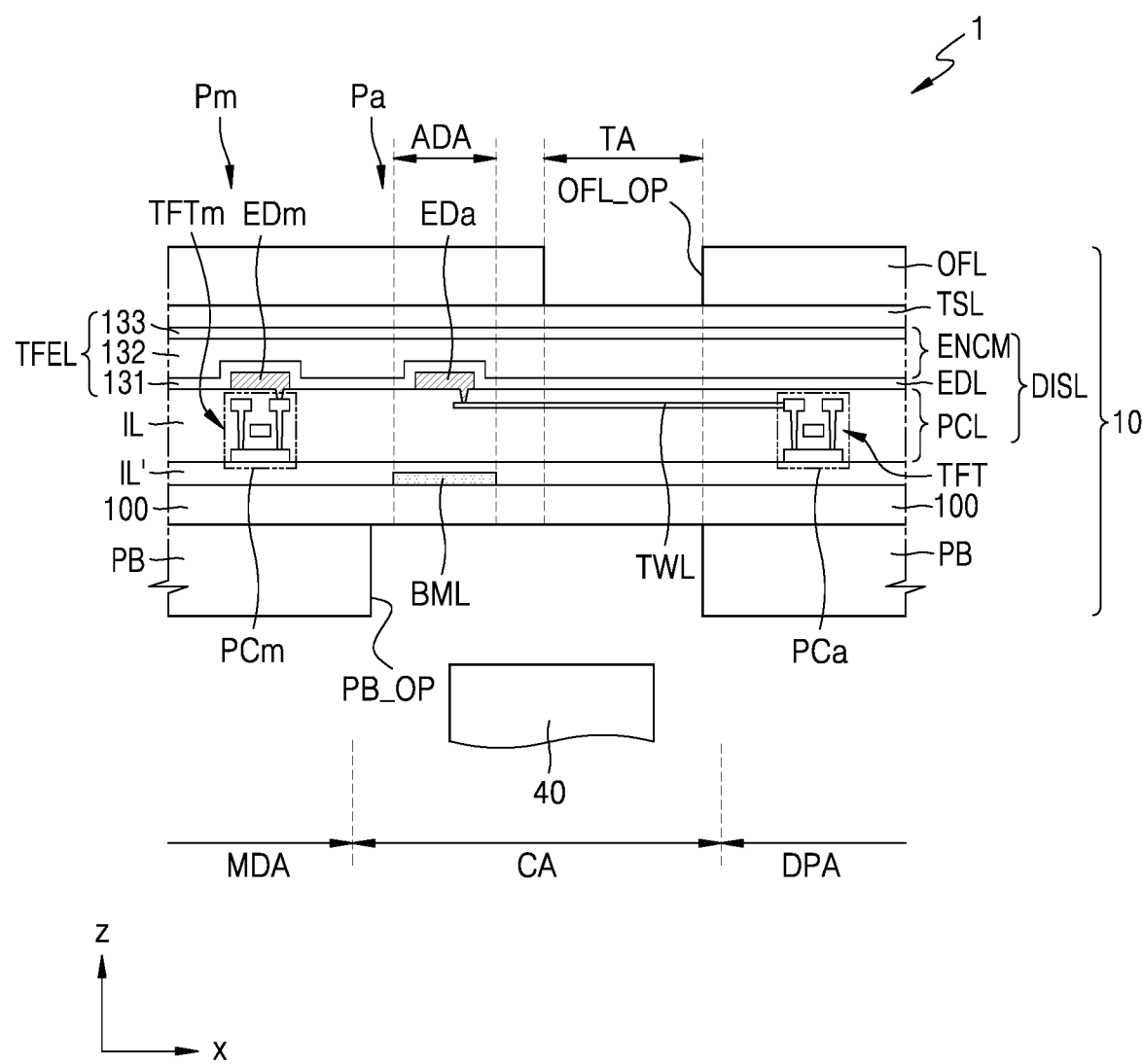
FIG. 2B is a cross-sectional view schematically illustrating a portion of a display apparatus according to some embodiments.

FIGS. 2A and 2B are cross-sectional views schematically illustrating a portion of a cross-section of a display apparatus 1 according to some embodiments.

Referring to FIG. 2A, the display apparatus 1 may include a display panel 10 and a component 40 arranged to overlap the display panel 10. A cover window for protecting the display panel 10 may be further arranged over the display panel 10.

The display panel 10 may include a component area CA overlapping the component 40 and a main display area MDA, where a main image is displayed. The display panel 10 may include a substrate 100, a display layer DISL over the substrate 100, a touch screen layer TSL, an optical functional layer OFL, and a panel protection member PB arranged under the substrate 100.

The display layer DISL may include a circuit layer PCL including thin film transistors TFTa and TFTb, a display element layer EDL including main and auxiliary light emitting elements EDm and EDa as display elements, and a thin film encapsulation layer TFEL or an encapsulation member ENCM such as an encapsulation substrate. Insulating layers IL and IL' may be arranged in the display layer DISL and between the substrate 100 and the display layer DISL.

The substrate 100 may include an insulating material such as glass, quartz, or polymer resin. The substrate 100 may include a rigid substrate or a flexible substrate capable of bending, folding, rolling, or the like.

A main pixel circuit PCm and a main light emitting element EDm connected thereto may be arranged in the main display area MDA of the display panel 10. The main pixel circuit PCm may include at least one thin film transistor TFTm and may control light emission of the main light emitting element EDm. A main subpixel Pm may be implemented by light emission of the main light emitting element EDm.

An auxiliary light emitting element EDa may be arranged in the component area CA of the display panel 10 to implement an auxiliary subpixel Pa. According to some embodiments, an auxiliary pixel circuit PCa driving the auxiliary light emitting element EDa may not be arranged in the component area CA but may be arranged in a peripheral area DPA that is a non-display area. According to some embodiments, the auxiliary pixel circuit PCa may be arranged in a portion of the main display area MDA or may be arranged between the main display area MDA and the component area CA. That is, the auxiliary pixel circuit PCa may be arranged not to overlap the auxiliary light emitting element EDa.

The auxiliary pixel circuit PCa may include at least one thin film transistor TFTa and may be electrically connected to the auxiliary light emitting element EDa by a connection line TWL. The connection line TWL may include a transparent conductive material. The auxiliary pixel circuit PCa may control light emission of the auxiliary light emitting element EDa. The auxiliary subpixel Pa may be implemented by light emission of the auxiliary light emitting element EDa. An area of the component area CA in which the auxiliary light emitting element EDa is arranged may be referred to as an auxiliary display area ADA.

Also, an area of the component area CA where the auxiliary light emitting element EDa as a display element is not arranged may be referred to as a transmission area TA. The transmission area TA may be an area through which the light/signal output from the component 40 or the light/signal input to the component 40 arranged corresponding to the component area CA is transmitted. The auxiliary display area ADA and the transmission area TA may be alternately arranged in the component area CA. The connection line TWL connecting the auxiliary pixel circuit PCa to the auxiliary light emitting element EDa may be arranged in the transmission area TA. Because the connection line TWL may include a transparent conductive material having relatively high transmittance, the transmittance of the transmission area TA may be secured even when the connection line TWL is arranged in the transmission area TA.

According to some embodiments, because the auxiliary pixel circuit PCa is not arranged in the component area CA, the area of the transmission area TA may be secured and thus the light transmittance thereof may be further improved.

The display element layer EDL may be covered by the thin film encapsulation layer TFEL or the encapsulation substrate. In some embodiments, the thin film encapsulation layer TFEL may include at least one inorganic encapsulation layer and at least one organic encapsulation layer as illustrated in FIG. 2. According to some embodiments, the thin film encapsulation layer TFEL may include first and second inorganic encapsulation layers 131 and 133 and an organic encapsulation layer 132 therebetween.

The first inorganic encapsulation layer 131 and the second inorganic encapsulation layer 133 may include one or more inorganic insulating materials such as silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide ($ZnO_2$) and may be formed by chemical vapor deposition (CVD) or the like. The organic encapsulation layer 132 may include a polymer-based material. The polymer-based material may include silicon-based resin, acryl-based resin, epoxy-based resin, polyimide, polyethylene, or the like.

The first inorganic encapsulation layer 131, the organic encapsulation layer 132, and the second inorganic encapsulation layer 133 may be integrally formed to cover the main display area MDA and the component area CA.

When the display element layer EDL is encapsulated by an encapsulation substrate, the encapsulation substrate may be arranged to face the substrate 100 with the display element layer EDL therebetween. A gap may be between the encapsulation substrate and the display element layer EDL. The encapsulation substrate may include glass. A sealant including frit or the like may be arranged between the substrate 100 and the encapsulation substrate, and the sealant may be arranged in the peripheral area DPA described above. The sealant arranged in the peripheral area DPA may surround the display area DA to prevent or reduce moisture or other contaminants penetrating through the side surface thereof.

The touch screen layer TSL may be configured to obtain coordinate information according to an external input, for example, a touch event. The touch screen layer TSL may include a touch electrode and touch lines connected to the touch electrode. The touch screen layer TSL may sense an external input by using a self-capacitance method or a mutual capacitance method.

The touch screen layer TSL may be formed over the thin film encapsulation layer TFEL. Alternatively, the touch screen layer TSL may be separately formed over a touch substrate and then coupled onto the thin film encapsulation layer TFEL through an adhesive layer such as an optical clear adhesive (OCA). According to some embodiments, the touch screen layer TSL may be directly formed over the thin film encapsulation layer TFEL, and in this case, an adhesive layer may not be between the touch screen layer TSL and the thin film encapsulation layer TFEL.

The optical functional layer OFL may include an anti-reflection layer. The anti-reflection layer may be configured to reduce the reflectance of light (external light) incident from the outside toward the display apparatus 1.

In some embodiments, the optical functional layer OFL may include a polarization film. The optical functional layer OFL may include an opening OFL_OP corresponding to the transmission area TA. Accordingly, the light transmittance of the transmission area TA may be significantly improved. The opening OFL_OP may be filled with a transparent material such as optically clear resin (OCR).

In some embodiments, the optical functional layer OFL may be provided as a filter plate including a black matrix and color filters.

The panel protection member PB may be attached under the substrate 100 to support and protect the substrate 100. The panel protection member PB may include an opening PB_OP corresponding to the component area CA. Because the panel protection member PB includes the opening PB_OP, the light transmittance of the component area CA may be improved. The panel protection member PB may include polyethylene terephthalate (PET) or polyimide (PI).

The area of the component area CA may be greater than the area where the component 40 is arranged. Accordingly, the area of the opening PB_OP included in the panel protection member PB may not match the area of the component area CA.

Also, a plurality of components 40 may be arranged in the component area CA. The plurality of components 40 may have different functions including, for example, emitting signals to external devices or elements and receiving signals from external devices or elements. For example, the plurality of components 40 may include at least two of a camera (imaging device), a solar cell, a flash, a proximity sensor, an illuminance sensor, and an iris sensor.

In FIG. 2A, a bottom metal layer BML is not arranged under the auxiliary light emitting element EDa of the component area CA; however, the display apparatus 1 according to some embodiments may include a bottom metal layer BML as illustrated in FIG. 2B.

The bottom metal layer BML may be arranged between the substrate 100 and the auxiliary light emitting element EDa to overlap the auxiliary light emitting element EDa. The bottom metal layer BML may block the external light from reaching the auxiliary light emitting element EDa. Moreover, the bottom metal layer BML may be formed to correspond to the entire component area CA and may be provided to include a lower hole corresponding to the transmission area TA. In this case, the lower hole may be provided in various shapes such as polygonal, circular, or irregular shapes to control the diffraction characteristics of external light.

Figure 3A:
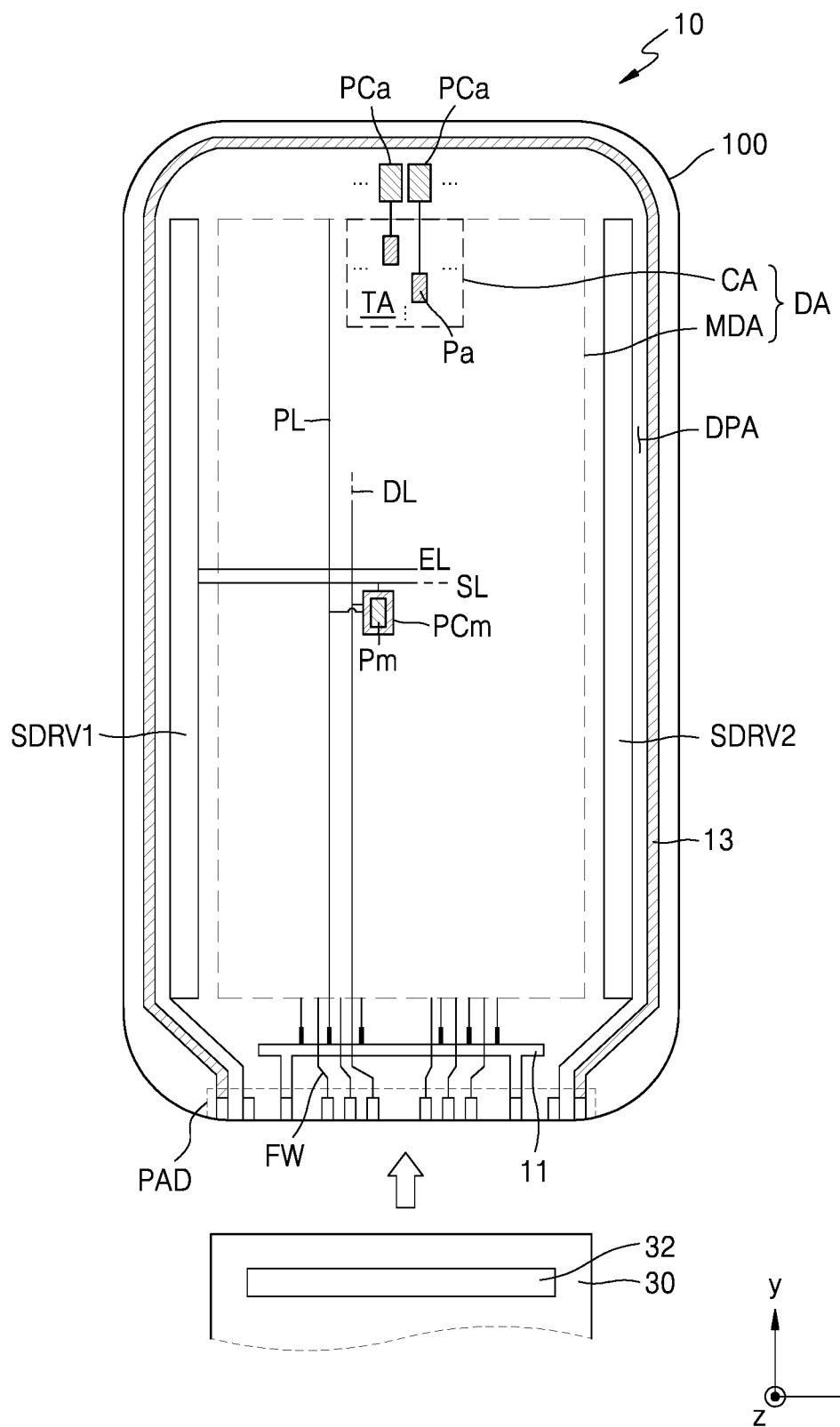
FIGS. 3A and 3B are plan views schematically illustrating a display panel that may be included in the display apparatus of FIG. 1 according to some embodiments.
Figure 3B:
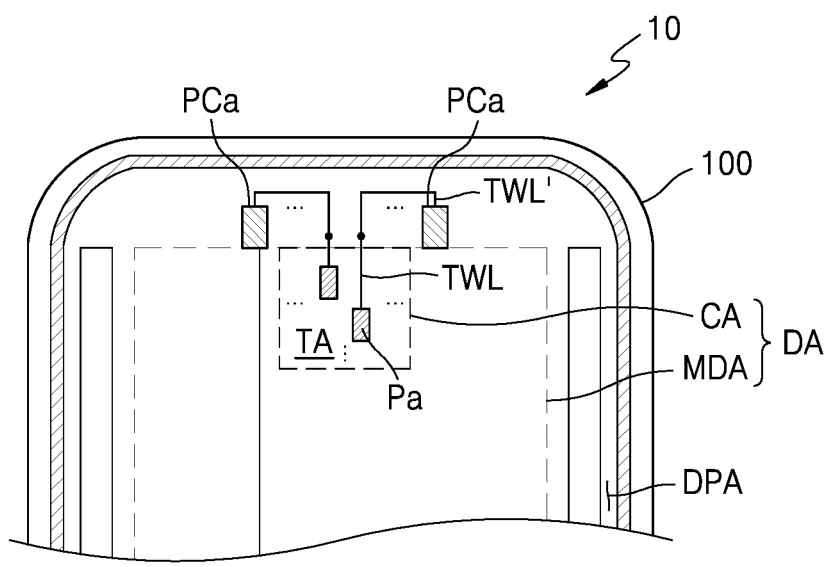

FIGS. 3A and 3B are plan views schematically illustrating a display panel that may be included in the display apparatus of FIG. 1.

Referring to FIG. 3A, various elements constituting a display panel 10 may be arranged over a substrate 100. The substrate 100 may include a display area DA and a peripheral area DPA surrounding the display area DA. The display area DA may include a main display area MDA in which a main image is displayed, and a component area CA which includes a transmission area TA and in which an auxiliary image is displayed. The auxiliary image may form an entire image together with the main image, and the auxiliary image may be an image independent from the main image.

A plurality of main subpixels Pm may be arranged in the main display area MDA. Each of the main subpixels Pm may be implemented by a display element such as an organic light emitting diode OLED. A main pixel circuit PCm driving the main subpixel Pm may be arranged in the main display area MDA, and the main pixel circuit PCm may be arranged to overlap the main subpixel Pm. Each main subpixel Pm may emit, for example, red, green, blue, or white light. The main display area MDA may be covered with an encapsulation member to be protected from external air or moisture.

The component area CA may be located at one side of the main display area MDA as described above or may be arranged inside the display area DA and surrounded by the main display area MDA. A plurality of auxiliary subpixels Pa may be arranged in the component area CA. Each of the plurality of auxiliary subpixels Pa may be implemented by a display element such as an organic light emitting diode. An auxiliary pixel circuit PCa driving the auxiliary subpixel Pa may be arranged in the peripheral area DPA close to the component area CA. For example, when the component area CA is arranged over the display area DA, the auxiliary pixel circuit PCa may be arranged over the peripheral area DPA. The auxiliary pixel circuit PCa and the display element implementing the auxiliary subpixel Pa may be connected by a connection line TWL extending in the y direction.

Each auxiliary subpixel Pa may emit, for example, red, green, blue, or white light. The component area CA may be covered with an encapsulation member to be protected from external air or moisture.

Moreover, the component area CA may include a transmission area TA. The transmission area TA may be arranged to surround a plurality of auxiliary subpixels Pa. Alternatively, the transmission area TA may be arranged in a grid form with a plurality of auxiliary subpixels Pa.

Because the component area CA includes a transmission area TA, the resolution of the component area CA may be lower than the resolution of the main display area MDA. For example, the resolution of the component area CA may be about ½, ⅜, ⅓, ¼, 2/9, ⅛, 1/9, or 1/16 of the resolution of the main display area MDA. For example, the resolution of the main display area MDA may be about 400 ppi or more, and the resolution of the component area CA may be about 200 ppi or about 100 ppi.

Each of the pixel circuits driving the main and auxiliary subpixels Pm and Pa may be electrically connected to the peripheral circuits arranged in the peripheral area DPA. A first scan driving circuit SDRV1, a second scan driving circuit SDRV2, a terminal portion PAD, a driving voltage supply line 11, and a common voltage supply line 13 may be arranged in the peripheral area DPA.

The first scan driving circuit SDRV1 may apply a scan signal to each of the main pixel circuits PCm driving the main subpixels Pm, through a main scan line SLm. The first scan driving circuit SDRV1 may apply an emission control signal to each pixel circuit through a main emission control line ELm. The second scan driving circuit SDRV2 may be located on the opposite side of the first scan driving circuit SDRV1 with respect to the main display area MDA and may be substantially parallel to the first scan driving circuit SDRV1. Some of the pixel circuits of the main subpixels Pm of the main display area MDA may be electrically connected to the first scan driving circuit SDRV1, and the others may be electrically connected to the second scan driving circuit SDRV2.

The terminal portion PAD may be arranged at one side of the substrate 100. The terminal portion PAD may be exposed by not being covered by an insulating layer, to be connected to a display circuit board 30. A display driver 32 may be arranged over the display circuit board 30.

The display driver 32 may generate a control signal transmitted to the first scan driving circuit SDRV1 and the second scan driving circuit SDRV2. The display driver 32 may generate a data signal, and the generated data signal may be transmitted to the main pixel circuits PCm through a fanout line FW and a main data line DL connected to the fanout line FW.

The display driver 32 may supply a driving voltage ELVDD to the driving voltage supply line 11 and may supply a common voltage ELVSS to the common voltage supply line 13. The driving voltage ELVDD may be applied to the pixel circuits of the main and auxiliary subpixels Pm and Pa through a driving voltage line PL connected to the driving voltage supply line 11, and the common voltage ELVSS may be connected to the common voltage supply line 13 to be applied to an opposite electrode of the display element.

The driving voltage supply line 11 may be provided to extend in the x direction under the main display area MDA. The common voltage supply line 13 may have a shape in which one side is open in a loop shape, to partially surround the main display area MDA.

Although FIG. 3A illustrates a case where there is one component area CA, the component area CA may be provided as a plurality of component areas CA. In this case, a plurality of component areas CA may be arranged to be spaced apart from each other, a first camera (or other sensor or signal emitter) may be arranged corresponding to a component area CA, and a second camera (or other sensor or signal emitter) may be arranged corresponding to another component area CA. Alternatively, a camera may be arranged corresponding to a component area CA, and an infrared sensor may be arranged corresponding to another component area CA. The shapes and sizes of the plurality of component areas CA may be different from each other.

Moreover, the component area CA may have a circular, elliptical, polygonal, or irregular shape. In some embodiments, the component area CA may have an octagonal shape. The component area CA may have any polygonal shape such as a tetragonal shape or a hexagonal shape. The component area CA may be surrounded by the main display area MDA.

Also, in FIG. 3A, the auxiliary pixel circuit PCa is arranged adjacent to the outer side of the component area CA; however, embodiments according to the disclosure are not limited thereto. As illustrated in FIG. 3B, the auxiliary pixel circuit PCa may be arranged adjacent to the outer side of the main display area MDA. In some embodiments, the connection line TWL may be connected to the auxiliary pixel circuit PCa through an additional connection line TWL'. In this case, the connection line TWL may be arranged in the component area CA, and the additional connection line TWL' may be arranged in the peripheral area DPA. The connection line TWL may include a transparent conductive material, and the additional connection line TWL' may include a metal having high conductivity. In some embodiments, the additional connection line TWL' may be arranged on the same layer as the connection line TWL. In other embodiments, the additional connection line TWL' may be arranged on a different layer than the connection line TWL and connected thereto through a contact hole.

Figure 4:
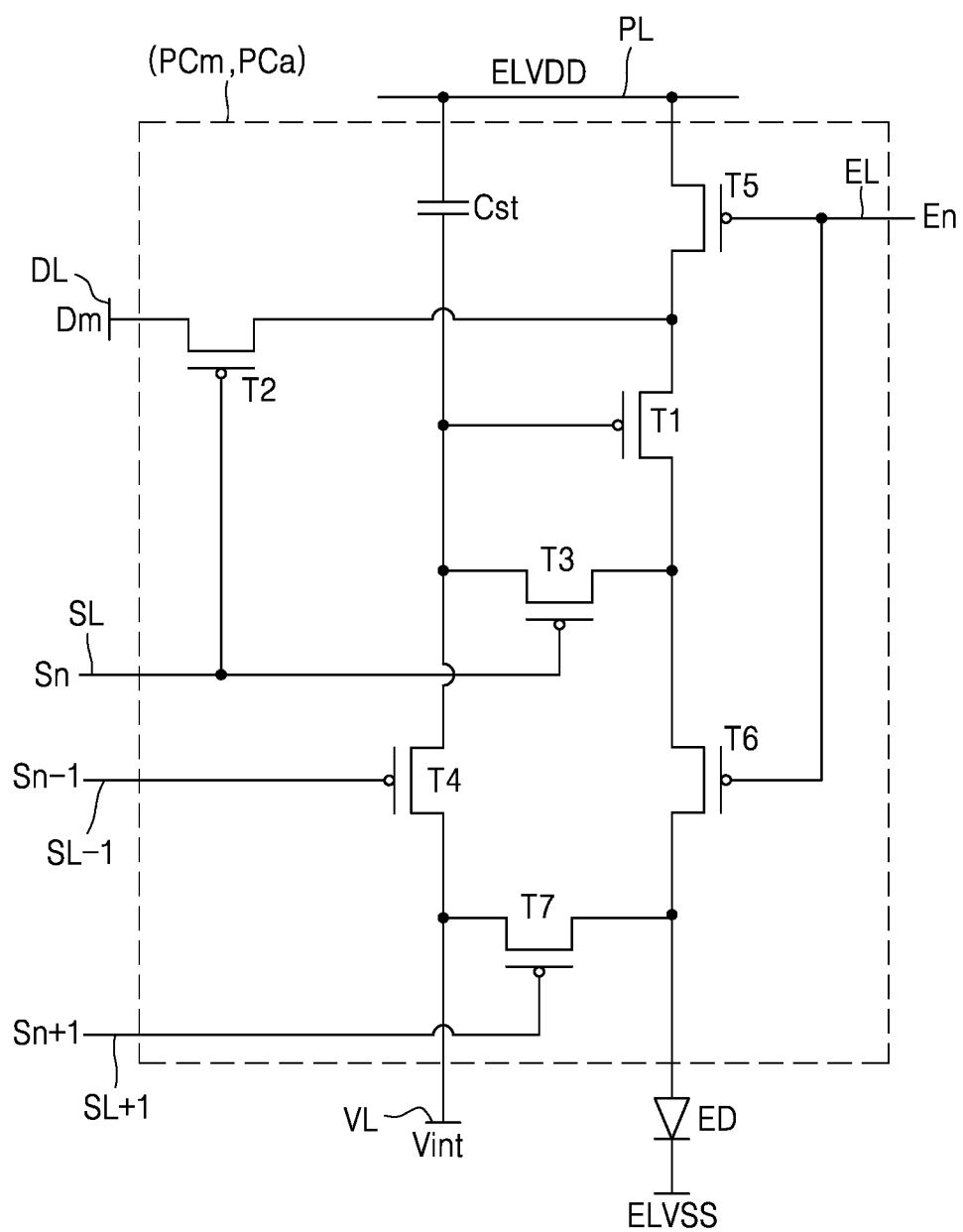
FIG. 4 is an equivalent circuit diagram of a main pixel circuit and/or an auxiliary pixel circuit according to some embodiments.

FIG. 4 is an equivalent circuit diagram of a main pixel circuit and/or an auxiliary pixel circuit according to some embodiments.

Referring to FIG. 4, a main pixel circuit PCm and/or an auxiliary pixel circuit PCa may include a driving thin film transistor T1, a switching thin film transistor T2, a compensation thin film transistor T3, a first initialization thin film transistor T4, an operation control thin film transistor T5, an emission control thin film transistor T6, a second initialization thin film transistor T7, and a storage capacitor Cst.

Although FIG. 4 illustrates a case where each of the main and auxiliary pixel circuits PCm and PCa includes signal lines SL, SL−1, SL+1, EL, and DL, an initialization voltage line VL, and a driving voltage line PL, embodiments according to the disclosure are not limited thereto. In other embodiments, at least one of the signal lines SL, SL−1, SL+1, EL, or DL and/or the initialization voltage line VL may be shared by adjacent pixel circuits.

The drain electrode of the driving thin film transistor T1 may be electrically connected to a light emitting element ED via the emission control thin film transistor T6. The driving thin film transistor T1 may receive a data signal Dm according to a switching operation of the switching thin film transistor T2 and supply a driving current to the light emitting element ED.

The gate electrode of the switching thin film transistor T2 may be connected to the scan line SL, and the source electrode thereof may be connected to the data line DL. The drain electrode of the switching thin film transistor T2 may be connected to the driving voltage line PL via the operation control thin film transistor T5 while being connected to the source electrode of the driving thin film transistor T1.

The switching thin film transistor T2 may be turned on according to a scan signal Sn received through the scan line SL, to perform a switching operation of transmitting the data signal Dm transmitted to the data line DL to the source electrode of the driving thin film transistor T1.

The gate electrode of the compensation thin film transistor T3 may be connected to the scan line SL. The source electrode of the compensation thin film transistor T3 may be connected to the pixel electrode of the light emitting element ED via the emission control thin film transistor T6 while being connected to the drain electrode of the driving thin film transistor T1. The drain electrode of the compensation thin film transistor T3 may be connected to any one electrode of the storage capacitor Cst, the source electrode of the first initialization thin film transistor T4, and the gate electrode of the driving thin film transistor T1. The compensation thin film transistor T3 may be turned on according to the scan signal Sn received through the scan line SL, to connect the gate electrode and the drain electrode of the driving thin film transistor T1 to each other to diode-connect the driving thin film transistor T1.

The gate electrode of the first initialization thin film transistor T4 may be connected to the previous scan line SL−1. The drain electrode of the first initialization thin film transistor T4 may be connected to the initialization voltage line VL. The source electrode of the first initialization thin film transistor T4 may be connected to any one electrode of the storage capacitor Cst, the drain electrode of the compensation thin film transistor T3, and the gate electrode of the driving thin film transistor T1. The first initialization thin film transistor T4 may be turned on according to a previous scan signal Sn−1 received through the previous scan line SL−1, to perform an initialization operation of initializing the voltage of the gate electrode of the driving thin film transistor T1 by transmitting an initialization voltage Vint to the gate electrode of the driving thin film transistor T1.

The gate electrode of the operation control thin film transistor T5 may be connected to the emission control line EL. The source electrode of the operation control thin film transistor T5 may be connected to the driving voltage line PL. The drain electrode of the operation control thin film transistor T5 may be connected to the source electrode of the driving thin film transistor T1 and the drain electrode of the switching thin film transistor T2.

The gate electrode of the emission control thin film transistor T6 may be connected to the emission control line EL. The source electrode of the emission control thin film transistor T6 may be connected to the drain electrode of the driving thin film transistor T1 and the source electrode of the compensation thin film transistor T3. The drain electrode of the emission control thin film transistor T6 may be electrically connected to the pixel electrode of the light emitting element ED. The operation control thin film transistor T5 and the emission control thin film transistor T6 may be simultaneously (or concurrently) turned on according to an emission control signal En received through the emission control line EL, such that a driving voltage ELVDD may be transmitted to the light emitting element ED and a driving current may flow through the light emitting element ED.

The gate electrode of the second initialization thin film transistor T7 may be connected to the next scan line SL+1. The source electrode of the second initialization thin film transistor T7 may be connected to the pixel electrode of the light emitting element ED. The drain electrode of the second initialization thin film transistor T7 may be connected to the initialization voltage line VL. The second initialization thin film transistor T7 may initialize the pixel electrode of the light emitting element ED by being turned on according to a next scan signal Sn+1 received through the next scan line SL+1.

Although FIG. 4 illustrates a case where the first initialization thin film transistor T4 and the second initialization thin film transistor T7 are respectively connected to the previous scan line SL−1 and the next scan signal SL+1, embodiments according to the disclosure are not limited thereto. According to some embodiments, both the first initialization thin film transistor T4 and the second initialization thin film transistor T7 may be connected to the previous scan line SLn−1 to be driven according to the previous scan signal Sn−1.

The other electrode of the storage capacitor Cst may be connected to the driving voltage line PL. Any one electrode of the storage capacitor Cst may be connected to the gate electrode of the driving thin film transistor T1, the drain electrode of the compensation thin film transistor T3, and the source electrode of the first initialization thin film transistor T4.

The opposite electrode (e.g., cathode) of the light emitting element ED may be provided with a common voltage ELVSS. The light emitting element ED may emit light by receiving a driving current from the driving thin film transistor T1.

The main and auxiliary pixel circuits PCm and PCa are not limited to the number and circuit design of the thin film transistors and storage capacitor described with reference to FIG. 4, and the number and circuit design thereof may be variously modified.

Figure 5:
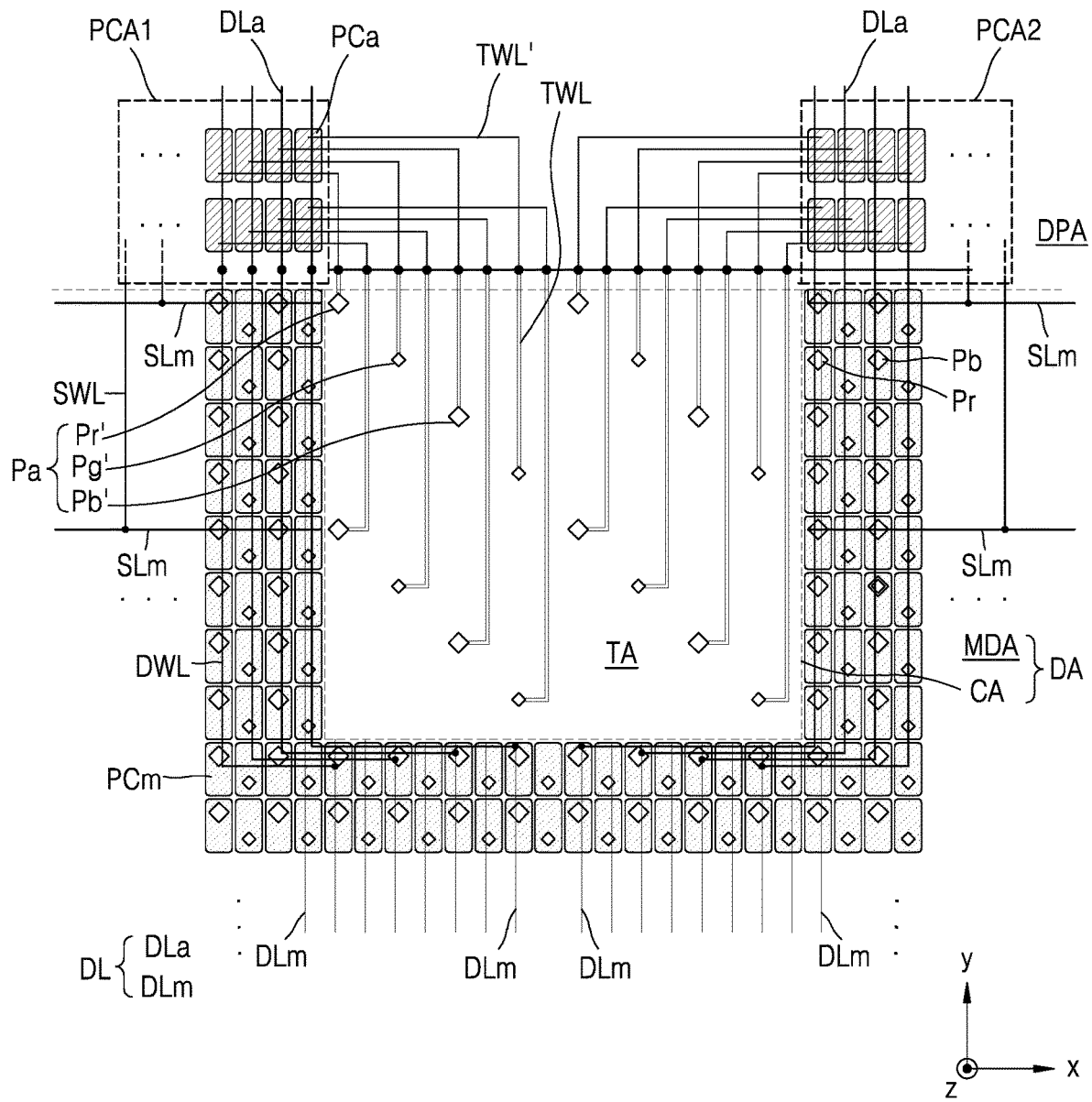
FIG. 5 is a schematic plan layout diagram illustrating a partial area of a display panel according to some embodiments.

FIG. 5 is a schematic plan layout diagram illustrating a partial area of a display panel according to some embodiments. For example, FIG. 5 illustrates a portion of a component area CA, a main display area MDA therearound, and a peripheral area DPA.

Referring to FIG. 5, a plurality of main subpixels Pm may be arranged in the main display area MDA. Herein, a subpixel may refer to an emission area that emits light by a display element as a minimum unit for implementing an image. Moreover, when an organic light emitting diode is used as a display element, the emission area may be defined by an opening of a pixel definition layer. This will be described in more detail below. Each of the plurality of main subpixels Pm may emit any one of red, green, blue, and white light.

In some embodiments, the main subpixels Pm arranged in the main display area MDA may include a first subpixel Pr, a second subpixel Pg, and a third subpixel Pb. The first subpixel Pr, the second subpixel Pg, and the third subpixel Pb may respectively implement red, green, and blue colors. The main subpixels Pm may be arranged in a pentile structure.

For example, the first subpixels Pr may be arranged at the first and third vertexes facing each other among the vertexes of a virtual square having a central point of the second subpixel Pg as a central point thereof and the third subpixels Pb may be arranged at the second and fourth vertexes that are the other vertexes thereof. The size of the second subpixel Pg may be less than the sizes of the first subpixel Pr and the third subpixel Pb.

Such a pixel arrangement structure may be referred to as a pentile matrix structure or a pentile structure, and high resolution may be implemented by a small number of pixels by applying a rendering drive that represents colors by sharing adjacent pixels.

Although FIG. 5 illustrates that a plurality of main subpixels Pm are arranged in a pentile matrix structure, embodiments according to the disclosure are not limited thereto. For example, a plurality of main subpixels Pm may be arranged in various forms such as a stripe structure, a mosaic arrangement structure, and a delta arrangement structure.

In the main display area MDA, main pixel circuits PCm may be arranged to overlap the main subpixels Pm, and the main pixel circuits PCm may be arranged in a matrix form in the x and y directions. Herein, a main pixel circuit PCm may refer to a unit of a pixel circuit that implements one main subpixel Pm.

A plurality of auxiliary subpixels Pa may be arranged in the component area CA. Each of the plurality of main subpixels Pm may emit any one of red, green, blue, and white light. The auxiliary subpixels Pa may include a first subpixel Pr', a second subpixel Pg', and a third subpixel Pb' that emit different colors. The first subpixel Pr', the second subpixel Pg', and the third subpixel Pb' may respectively implement red, green, and blue colors.

The number per unit area of the auxiliary subpixels Pa arranged in the component area CA may be less than the number per unit area of the main subpixels Pm arranged in the main display area MDA. For example, the number of auxiliary subpixels Pa and the number of main subpixels Pm arranged per the same area may be in the ratio of 1:2, 1:4, 1:8, or 1:9. That is, the resolution of the component area CA may be ½, ¼, ⅛, or ⅑ of the resolution of the main display area MDA. FIG. 5 illustrates a case where the resolution of the component area CA is ⅛ of the resolution of the main display area MDA.

The auxiliary subpixels Pa arranged in the component area CA may be arranged in various forms. Some auxiliary subpixels Pa among the auxiliary subpixels Pa may be collected to form a pixel group and may be arranged in various forms such as a pentile structure, a stripe structure, a mosaic arrangement structure, or a delta arrangement structure in the pixel group. In this case, the distance between the auxiliary subpixels Pa arranged in the pixel group may be equal to the distance between the main subpixels Pm.

Alternatively, as illustrated in FIG. 5, the auxiliary subpixels Pa may be distributed and arranged in the component area CA. That is, the distance between the auxiliary subpixels Pa may be greater than the distance between the main subpixels Pm. Moreover, an area in which the auxiliary subpixels Pa are not arranged in the component area CA may be referred to as a transmission area TA having relatively high light transmittance.

The auxiliary pixel circuits PCa implementing light emission of the auxiliary subpixels Pa may be arranged in the peripheral area DPA. Because the auxiliary pixel circuits PCa are not arranged in the component area CA, the component area CA may secure a wider transmission area TA. Also, because lines for applying a constant voltage and signals to the auxiliary pixel circuit PCa are not arranged in the component area CA, the auxiliary subpixels Pa may be freely arranged without considering the arrangement of the lines.

The auxiliary subpixels Pa may be divided into a first pixel circuit unit PCA1 and a second pixel circuit unit PCA2 that are spaced apart from each other in the peripheral area DPA. For example, the auxiliary pixel circuits PCa driving the auxiliary subpixels Pa arranged on the left side of the component area CA, among the auxiliary subpixels Pa may be arranged in the first pixel circuit unit PCA1, and the auxiliary pixel circuits PCa driving the auxiliary subpixels Pa arranged on the right side of the component area CA, among the auxiliary subpixels Pa may be arranged in the second pixel circuit unit PCA2.

The first pixel circuit unit PCA1 and the second pixel circuit unit PCA2 may not be arranged to correspond to one side of the component area CA but may be arranged adjacent to the outer side of the main display area MDA. That is, the first pixel circuit unit PCA1 and the second pixel circuit unit PCA2 may be arranged more adjacent to the main display area MDA than to the component area CA. The first pixel circuit unit PCA1 and the second pixel circuit unit PCA2 may be arranged to be spaced apart from each other by a distance of about the width of the component area CA in the x direction. However, embodiments according to the disclosure are not limited thereto. For example, the first pixel circuit unit PCA1 and the second pixel circuit unit PCA2 may also be arranged adjacent to the outer side of the component area CA.

The auxiliary pixel circuits PCa may be connected to the auxiliary subpixels Pa by connection lines TWL and additional connection lines TWL'. The connection line TWL may be arranged in the component area CA and may include a transparent conductive material. For example, the connection line TWL may include a transparent conductive oxide (TCO). The connection line TWL may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO).

The additional connection line TWL' may be arranged in the peripheral area DPA and connected to the auxiliary pixel circuit PCa. The additional connection line TWL' may include a conductive material including molybdenum (Mo), aluminum (Al), copper (Cu), titanium (Ti), or the like and may include a single layer or a multiple layer including the above material. The additional connection line TWL' may be connected to the connection line TWL at the edge of the component area CA.

When the connection line TWL and the additional connection line TWL' are connected to the auxiliary subpixel Pa, it may mean that the connection line TWL and the additional connection line TWL' are electrically connected to the pixel electrode of the display element implementing the auxiliary subpixel Pa.

The additional connection line TWL' and the connection line TWL may be arranged on the same layer or may be arranged on different layers. When the additional connection line TWL' and the connection line TWL are arranged on different layers, they may be connected through a contact hole.

The additional connection line TWL' may have higher conductivity than the connection line TWL. Because the additional connection line TWL' is arranged in the peripheral area DPA and thus there may be no need to secure light transmittance, the additional connection line TWL' may include a material having lower light transmittance and higher conductivity than the connection line TWL. Accordingly, the resistance value of the connection line TWL may be minimized or relatively reduced.

A main scan line SLm may extend in the x direction and may be connected to the main pixel circuits PCm arranged in the same row. The main scan line SLm may not be arranged in the component area CA. That is, the main scan line SLm may be disconnected with the component area CA therebetween. In this case, the main scan line SLm arranged on the left side of the component area CA may receive a signal from the second scan driving circuit SDRV2 (see FIG. 3A), and the main scan line SLm arranged on the right side of the component area CA Line SLm may receive a signal from the first scan driving circuit SDRV1 (see FIG. 3A).

Some of the main scan lines SLm may be connected to the auxiliary pixel circuits PCa after being branched by scan connection lines SWL. Accordingly, some of the auxiliary pixel circuits PCa may receive the same scan signal as the main pixel circuits PCm. For example, the same signal may be applied to the pixel circuits driving the main subpixel Pm and the auxiliary subpixel Pa arranged in the same row. The scan connection line SWL may extend in the y direction and may be connected to the auxiliary pixel circuits PCa arranged in the first pixel circuit unit PCA1 or the second pixel circuit unit PCA2.

A data line DL may include a main data line DLm connected to the main pixel circuits PCm and an auxiliary data line DLa connected to the auxiliary pixel circuits PCa. The main data line DLm may extend in the y direction and may be connected to the main pixel circuits PCm arranged in the same column. The auxiliary data line DLa may extend in the y direction and may be connected to the auxiliary pixel circuits PCa arranged in the same column.

The main data line DLm and the auxiliary data line DLa may be connected by a data connection line DWL. The data connection line DWL may be arranged to bypass the component area CA. The data connection line DWL may be arranged to overlap the main pixel circuits PCm arranged in the main display area MDA. As the data connection line DWL is arranged in the main display area MDA, because it is not necessary to secure a separate space in which the data connection line DWL is arranged, a dead-space area may be minimized or relatively reduced.

The data connection line DWL may be arranged on a different layer than the main data line DLm and the auxiliary data line DLa, and thus, the data connection line DWL may be connected to the main data line DLm and the auxiliary data line DLa through contact holes, respectively.

Figure 6:
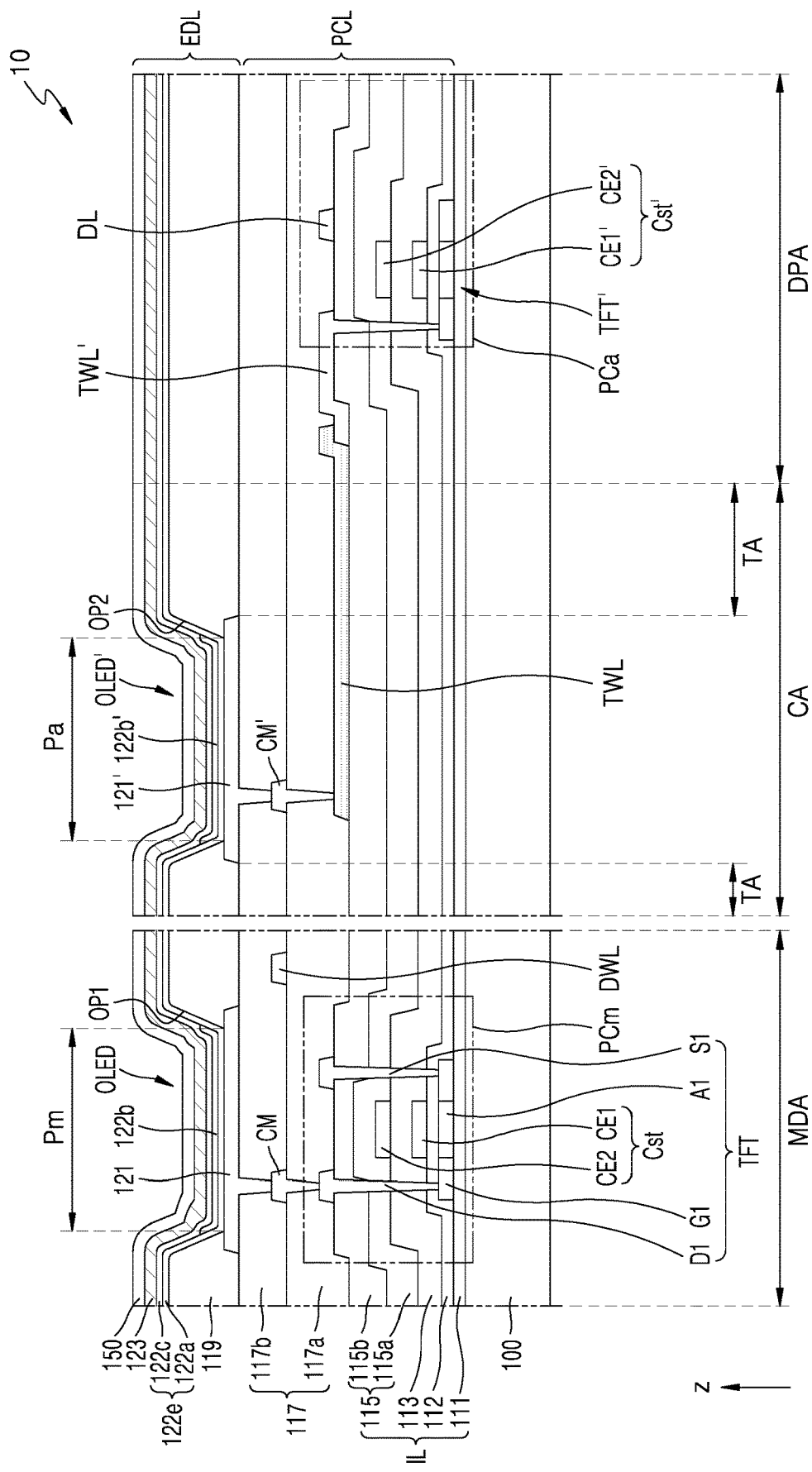
FIG. 6 is a schematic cross-sectional view illustrating a portion of a display panel according to some embodiments.

FIG. 6 is a schematic cross-sectional view illustrating a portion of a display panel 10 according to some embodiments, which is a cross-sectional view schematically illustrating a portion of a main display area MDA, a component area CA, and a peripheral area DPA.

Referring to FIG. 6, a main subpixel Pm may be arranged in the main display area MDA, and the component area CA may include an auxiliary subpixel Pa and a transmission area TA. A main pixel circuit PCm including a main thin film transistor TFT and a main storage capacitor Cst, and a main organic light emitting diode OLED as a display element connected to the main pixel circuit PCm may be arranged in the main display area MDA. An auxiliary organic light emitting diode OLED' may be arranged in the component area CA. An auxiliary pixel circuit PCa including an auxiliary thin film transistor TFT' and an auxiliary storage capacitor Cst' may be arranged in the peripheral area DPA. Moreover, a connection line TWL connecting the auxiliary pixel circuit PCa to the auxiliary organic light emitting diode OLED' may be arranged in the component area CA and the peripheral area DPA.

According to some embodiments, an organic light emitting diode is used as a display element; however, in other embodiments, an inorganic light emitting element or a quantum dot light emitting element may be used as a display element.

Hereinafter, a structure in which the components included in the display panel 10 are stacked will be described. The display panel 10 may include a stack of a substrate 100, a buffer layer 111, a circuit layer PCL, and a display element layer EDL.

The substrate 100 may include an insulating material such as glass, quartz, or polymer resin. The substrate 100 may include a rigid substrate or a flexible substrate capable of bending, folding, rolling, or the like.

The buffer layer 111 may be located over the substrate 100 to reduce or block the penetration of foreign materials, moisture, external air, or other contaminants from the bottom of the substrate 100 and may provide a relatively flat or planar surface over the substrate 100. The buffer layer 111 may include an inorganic material such as oxide or nitride, an organic material, or an organic/inorganic composite and may include a single-layer or multiple-layer structure of an inorganic material and an organic material. A barrier layer for blocking the penetration of external air may be further included between the substrate 100 and the buffer layer 111. In some embodiments, the buffer layer 111 may include silicon oxide ($SiO_2$) or silicon nitride ($SiN_x$).

The circuit layer PCL may be arranged over the buffer layer 111 and may include the main and auxiliary pixel circuits PCm and PCa, a first gate insulating layer 112, a second gate insulating layer 113, an interlayer insulating layer 115, and a planarization layer 117. The main pixel circuit PCm may include a main thin film transistor TFT and a main storage capacitor Cst, and the auxiliary pixel circuit PCa may include an auxiliary thin film transistor TFT' and an auxiliary storage capacitor Cst'.

The main thin film transistor TFT and the auxiliary thin film transistor TFT' may be arranged over the buffer layer 111. The main thin film transistor TFT may include a first semiconductor layer A1, a first gate electrode G1, a first source electrode S1, and a first drain electrode D1. The main thin film transistor TFT may be connected to the main organic light emitting diode OLED to drive the main organic light emitting diode OLED. The auxiliary thin film transistor TFT' may be connected to the auxiliary organic light emitting diode OLED' to drive the auxiliary organic light emitting diode OLED'. The auxiliary thin film transistor TFT' has a similar configuration to the main thin film transistor TFT, and thus, a description of the auxiliary thin film transistor TFT' will be replaced with the description of the main thin film transistor TFT.

The first semiconductor layer A1 may be arranged over the buffer layer 111 and may include polysilicon. According to some embodiments, the first semiconductor layer A1 may include amorphous silicon. According to some embodiments, the first semiconductor layer A1 may include an oxide of at least one of indium (In), gallium (Ga), stannum (Sn), zirconium (Zr), vanadium (V), hafnium (Hf), cadmium (Cd), germanium (Ge), chromium (Cr), titanium (Ti), or zinc (Zn). The first semiconductor layer A1 may include a channel area and a source area and a drain area that are doped with dopants.

The first gate insulating layer 112 may be provided to cover the first semiconductor layer A1. The first gate insulating layer 112 may include an inorganic insulating material such as silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide ($ZnO_2$). The first gate insulating layer 112 may include a single layer or a multiple layer including the above inorganic insulating material.

The first gate electrode G1 may be arranged over the first gate insulating layer 112 to overlap the first semiconductor layer A1. The first gate electrode G1 may include molybdenum (Mo), aluminum (Al), copper (Cu), titanium (Ti), or the like and may include a single layer or a multiple layer. For example, the first gate electrode G1 may include a single Mo layer.

The second gate insulating layer 113 may be provided to cover the first gate electrode G1. The second gate insulating layer 113 may include an inorganic insulating material such as silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide ($ZnO_2$). The second gate insulating layer 113 may include a single layer or a multiple layer including the above inorganic insulating material.

An upper electrode CE2 of the main storage capacitor Cst and an upper electrode CE2' of the auxiliary storage capacitor Cst' may be arranged over the second gate insulating layer 113.

In the main display area MDA, the upper electrode CE2 of the main storage capacitor Cst may overlap the first gate electrode G1 thereunder. The first gate electrode G1 and the upper electrode CE2 overlapping each other with the second gate insulating layer 113 therebetween may constitute the main storage capacitor Cst. The first gate electrode G1 may be a lower electrode CE1 of the main storage capacitor Cst.

In the main display area MDA, the upper electrode CE2' of the auxiliary storage capacitor Cst' may overlap the gate electrode of the auxiliary thin film transistor TFT' thereunder. The gate electrode of the auxiliary thin film transistor TFT' may be a lower electrode CE1' of the auxiliary storage capacitor Cst'.

The upper electrodes CE2 and CE2' may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu) and may include a single layer or a multiple layer of the above material.

The interlayer insulating layer 115 may be formed to cover the upper electrodes CE2 and CE2'. The interlayer insulating layer 115 may include silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide ($ZnO_2$). The interlayer insulating layer 115 may include a single layer or a multiple layer including the above inorganic insulating material. According to some embodiments, the interlayer insulating layer 115 may include a stack of a first interlayer insulating layer 115a and a second interlayer insulating layer 115b. In this case, the first interlayer insulating layer 115a may include silicon oxide (SiOx), and the second interlayer insulating layer may include silicon nitride ($SiN_x$).

The first source electrode S1 and the first drain electrode D1 may be arranged over the interlayer insulating layer 115. The first source electrode S1 and the first drain electrode D1 may include a conductive material including molybdenum (Mo), aluminum (Al), copper (Cu), titanium (Ti), or the like and may include a single layer or a multiple layer including the above material. For example, the first source electrode S1 and the first drain electrode D1 may include a multiple-layer structure of Ti/Al/Ti.

The connection line TWL connected to the auxiliary pixel circuit PCa may be arranged over the interlayer insulating layer 115. The connection line TWL may be arranged to extend from the peripheral area DPA to the component area CA to connect the auxiliary organic light emitting diode OLED' to the auxiliary pixel circuit PCa. Also, a data line DL may be arranged over the interlayer insulating layer 115.

The connection line TWL may be connected to an additional connection line TWL'. The additional connection line TWL' may be arranged in the peripheral area DPA and connected to the auxiliary pixel circuit PCa, for example, the auxiliary thin film transistor TFT'. The connection line TWL may be arranged in the transmission area TA of the component area CA. The connection line TWL may be arranged on the same layer as the additional connection line TWL' and may include a different material than the additional connection line TWL'. The end of the connection line TWL may be provided to cover the end of the additional connection line TWL'.

The additional connection line TWL' may include a conductive material including molybdenum (Mo), aluminum (Al), copper (Cu), titanium (Ti), or the like and may include a single layer or a multiple layer including the above material. The additional connection line TWL' may include the same material as the data line DL.

The connection line TWL may include a transparent conductive material. For example, the connection line TWL may include a transparent conductive oxide (TCO). The connection line TWL may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO).

The additional connection line TWL' may have higher conductivity than the connection line TWL. Because the additional connection line TWL' is arranged in the peripheral area DPA and thus there is no need to secure light transmittance, the additional connection line TWL' may include a material having lower light transmittance and higher conductivity than the connection line TWL.

The planarization layer 117 may be arranged to cover the first source electrode S1, the first drain electrode D1, and the connection line TWL. The planarization layer 117 may have a flat top surface such that a first pixel electrode 121 and a second pixel electrode 121' arranged thereover may be formed flat.

The planarization layer 117 may include an organic material or an inorganic material and may have a single-layer structure or a multiple-layer structure. The planarization layer 117 may include a first planarization layer 117a and a second planarization layer 117b. Accordingly, a conductive pattern such as a line may be formed between the first planarization layer 117a and the second planarization layer 117b, which may enable relatively high integration. Connection electrodes CM and CM' and a data connection line DWL may be arranged over the first planarization layer 117a.

The planarization layer 117 may include a general-purpose polymer such as benzocyclobutene (BCB), polyimide, hexamethyldisiloxane (HMDSO), polymethylmethacrylate (PMMA), or polystyrene (PS), a polymer derivative having a phenolic group, an acrylic polymer, an imide-based polymer, an arylether-based polymer, an amide-based polymer, a fluorine-based polymer, a p-xylene-based polymer, or a vinyl alcohol-based polymer. Moreover, the planarization layer 117 may include an inorganic insulating material such as silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide ($ZnO_2$). When the planarization layer 117 is formed, after a layer is formed, chemical mechanical polishing may be performed on a top surface of the layer to provide a flat top surface.

The first planarization layer 117a may be arranged to cover the main and auxiliary pixel circuits PCm and PCa. The second planarization layer 117b may be arranged over the first planarization layer 117a and may have a flat top surface such that the first and second pixel electrodes 121 and 121' may be formed flat.

The organic light emitting diodes OLED and OLED' may be arranged over the second planarization layer 117b. The first and second pixel electrodes 121 and 121' of the organic light emitting diodes OLED and OLED' may be connected to the main and auxiliary pixel circuits PCm and PCa through connection electrodes CM and CM' arranged over the first planarization layer 117a.

The first pixel electrode 121 and the second pixel electrode 121' may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). The first pixel electrode 121 and the second pixel electrode 121' may include a reflection layer including silver (Ag), magnesium (Mg), aluminum (Al), platinum (Pt), palladium (Pd), gold (Au), nickel (Ni), neodymium (Nd), iridium (Ir), chromium (Cr), or any compound thereof. For example, the first pixel electrode 121 and the second pixel electrode 121' may have a structure including layers formed of ITO, IZO, ZnO, or $In_2O_3$ over/under the reflection layer. In this case, the first pixel electrode 121 and the second pixel electrode 121' may have a stack structure of ITO/Ag/ITO.

A pixel definition layer 119 may cover the edges of the first pixel electrode 121 and the second pixel electrode 121' over the planarization layer 117 and may include a first opening OP1 and a second opening OP2 for exposing the central portions of the first pixel electrode 121 and the second pixel electrode 121'. The first opening OP1 and the second opening OP2 may define the emission areas of the organic light emitting diodes OLED and OLED', that is, the sizes and shapes of the subpixels Pm and Pa.

The pixel definition layer 119 may increase the distance between the edge of the first and second pixel electrodes 121 and 121' and an opposite electrode 123 over the first and second pixel electrodes 121 and 121' to prevent an arc or the like from occurring at the edge of the first and second pixel electrodes 121 and 121'. The pixel definition layer 119 may be formed of an organic insulating material such as polyimide, polyamide, acrylic resin, benzocyclobutene, hexamethyldisiloxane (HMDSO), or phenol resin by spin coating or the like.

A first emission layer 122b and a second emission layer 122b' formed to respectively correspond to the first pixel electrode 121 and the second pixel electrode 121' may be arranged inside the first opening OP1 and the second opening OP2 of the pixel definition layer 119. The first emission layer 122b and the second emission layer 122b' may include a high molecular weight material or a low molecular weight material and may emit red, green, blue, or white light.

An organic functional layer 122e may be arranged over and/or under the first emission layer 122b and the second emission layer 122b'. The organic functional layer 122e may include a first functional layer 122a and/or a second functional layer 122c. The first functional layer 122a or the second functional layer 122c may be omitted.

The first functional layer 122a may be arranged under the first emission layer 122b and the second emission layer 122b'. The first functional layer 122a may include a single layer or a multiple layer including an organic material. The first functional layer 122a may include a hole transport layer (HTL) having a single-layer structure. Alternatively, the first functional layer 122a may include a hole injection layer (HIL) and an HTL. The first functional layer 122a may be integrally formed to correspond to the organic light emitting diodes OLED and OLED' included in the main display area MDA and the component area CA.

The second functional layer 122c may be arranged over the first emission layer 122b and the second emission layer 122b'. The second functional layer 122c may include a single layer or a multiple layer including an organic material. The second functional layer 122c may include an electron transport layer (ETL) and/or an electron injection layer (EIL). The second functional layer 122c may be integrally formed to correspond to the organic light emitting diodes OLED and OLED' included in the main display area MDA and the component area CA.

The opposite electrode 123 may be arranged over the second functional layer 122c. The opposite electrode 123 may include a conductive material having a low work function. For example, the opposite electrode 123 may include a (semi)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or any alloy thereof. Alternatively, the opposite electrode 123 may further include a layer such as ITO, IZO, ZnO, or $In_2O_3$ over the (semi)transparent layer including the above material. The opposite electrode 123 may be integrally formed to correspond to the organic light emitting diodes OLED and OLED' included in the main display area MDA and the component area CA.

The layers from the first pixel electrode 121 to the opposite electrode 123 formed in the main display area MDA may constitute the main organic light emitting diode OLED. The layers from the second pixel electrode 121' to the opposite electrode 123 formed in the component area CA may constitute the auxiliary organic light emitting diode OLED'.

A top layer 150 including an organic material may be formed over the opposite electrode 123. The top layer 150 may be provided to protect the opposite electrode 123 and improve light extraction efficiency. The top layer 150 may include an organic material having a higher refractive index than the opposite electrode 123. Alternatively, the top layer 150 may include a stack of layers having different refractive indexes. For example, the top layer 150 may include a stack of a high refractive index layer/a low refractive index layer/a high refractive index layer. In this case, the refractive index of the high refractive index layer may be about 1.7 or more, and the refractive index of the low refractive index layer may be about 1.3 or less.

The top layer 150 may further include LiF. Alternatively, the top layer 150 may further include an inorganic insulating material such as silicon oxide ($SiO_2$) or silicon nitride ($SiN_x$).

Figure 7:
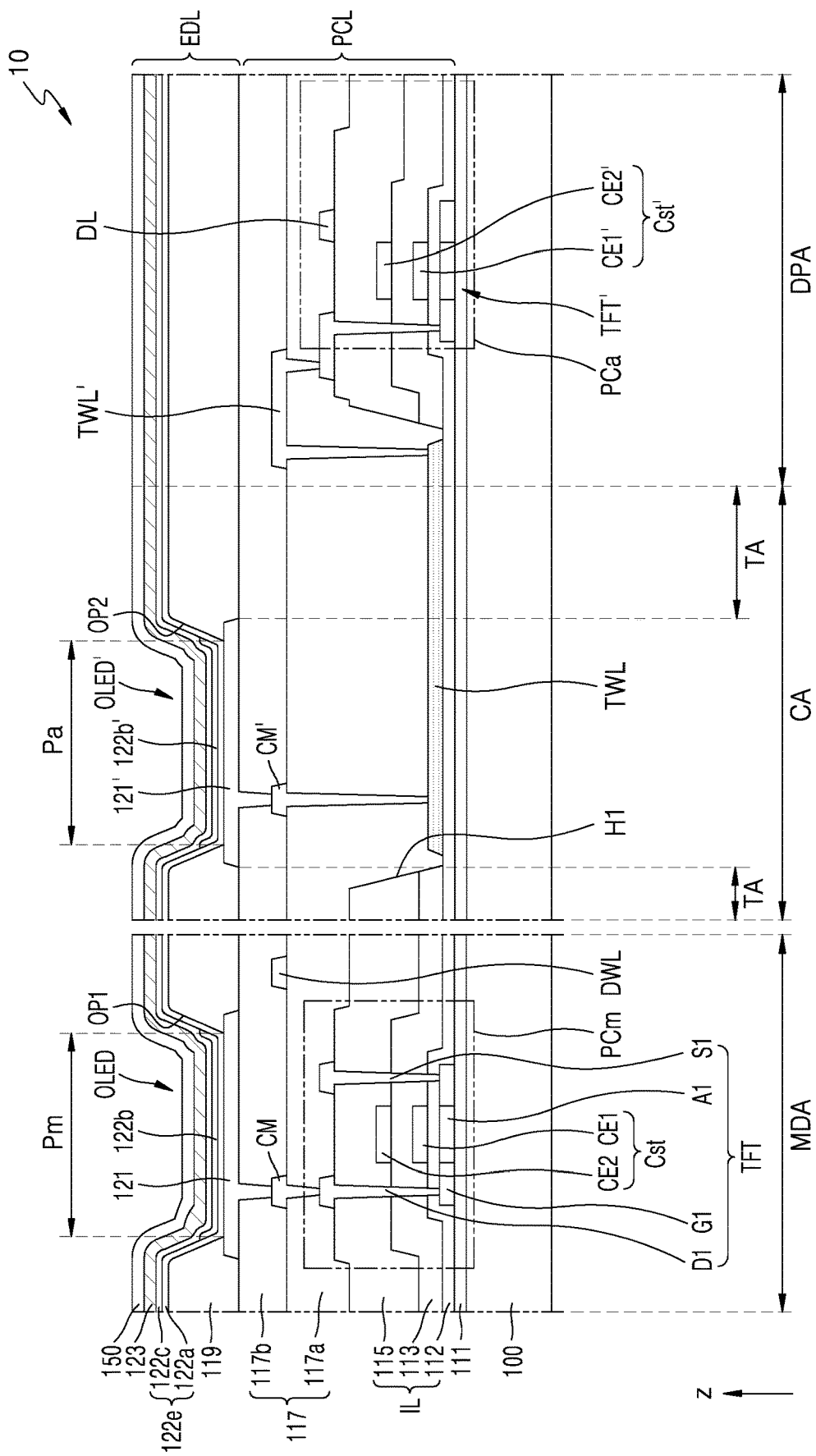
FIG. 7 is a schematic cross-sectional view illustrating a portion of a display panel according to some embodiments.

FIG. 7 is a schematic cross-sectional view illustrating a portion of a display panel 10 according to some embodiments. In FIG. 7, like reference numerals as those in FIG. 6 denote like members, and thus, redundant descriptions thereof will be omitted for conciseness.

Referring to FIG. 7, the display panel 10 may include a main display area MDA, a component area CA, and a peripheral area DPA. A main subpixel Pm may be arranged in the main display area MDA, and the component area CA may include an auxiliary subpixel Pa and a transmission area TA. A main pixel circuit PCm including a main thin film transistor TFT and a main storage capacitor Cst, and a main organic light emitting diode OLED as a display element connected to the main pixel circuit PCm may be arranged in the main display area MDA. An auxiliary organic light emitting diode OLED' may be arranged in the component area CA. An auxiliary pixel circuit PCa including an auxiliary thin film transistor TFT' and an auxiliary storage capacitor Cst' may be arranged in the peripheral area DPA. Moreover, a connection line TWL connecting the auxiliary pixel circuit PCa to the auxiliary organic light emitting diode OLED' may be arranged in the component area CA and the peripheral area DPA.

According to some embodiments, an inorganic insulating layer IL of the display panel 10 may have a hole corresponding to the component area CA.

For example, when the first gate insulating layer 112, the second gate insulating layer 113, and the interlayer insulating layer 115 are collectively referred to as the inorganic insulating layer IL, the inorganic insulating layer IL may include a first hole H1 corresponding to the transmission area TA. The first hole H1 may expose a portion of the top surface of the substrate 100 or the buffer layer 111. The first hole H1 may overlap an opening of the first gate insulating layer 112, an opening of the second gate insulating layer 113, and an opening of the interlayer insulating layer 115 formed to correspond to the component area CA. The openings may be separately formed through separate processes or may be simultaneously (or concurrently) formed through the same process. When the openings are formed in separate processes, the inner surface of the first hole H1 may not be smooth and may have a stair-shaped step.

According to some embodiments, the connection line TWL may be provided inside the first hole H1. The connection line TWL may be arranged over the buffer layer 111 in the component area CA. The connection line TWL may be connected through a contact hole to an additional connection line TWL' arranged over the first planarization layer 117a and may be connected to the auxiliary pixel circuit PCa through the additional connection line TWL'. The other end of the connection line TWL may be connected to the connection electrode CM' through a contact hole, and the connection line TWL may be connected to the second pixel electrode 121' by the connection electrode CM'.

Although FIG. 7 illustrates that the additional connection line TWL' is arranged over the first planarization layer 117a, embodiments according to the disclosure are not limited thereto. In some embodiments, the additional connection line TWL' may be arranged over the second planarization layer 117b. That is, the additional connection line TWL' may be arranged on the same layer as the pixel electrode 121. Also, the position of the additional connection line TWL' may be variously modified such as being arranged over the same layer as the first gate electrode G1 of the main thin film transistor TFT or being arranged over the same layer as the upper electrode CE2 of the main storage capacitor Cst.

Figure 8:
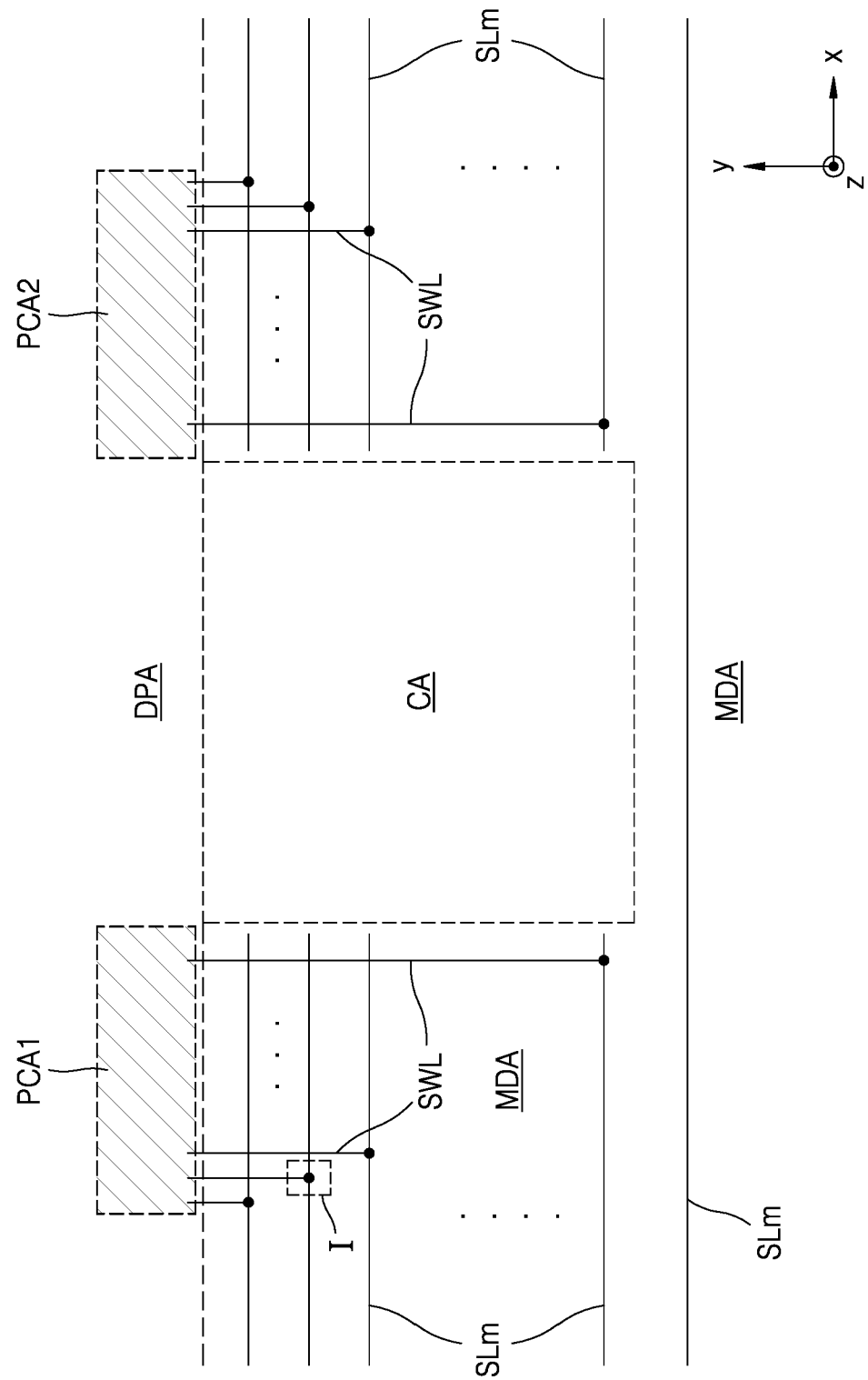
FIG. 8 is a schematic plan layout diagram illustrating signal lines arranged in a partial area of a display panel according to some embodiments.
Figure 9:
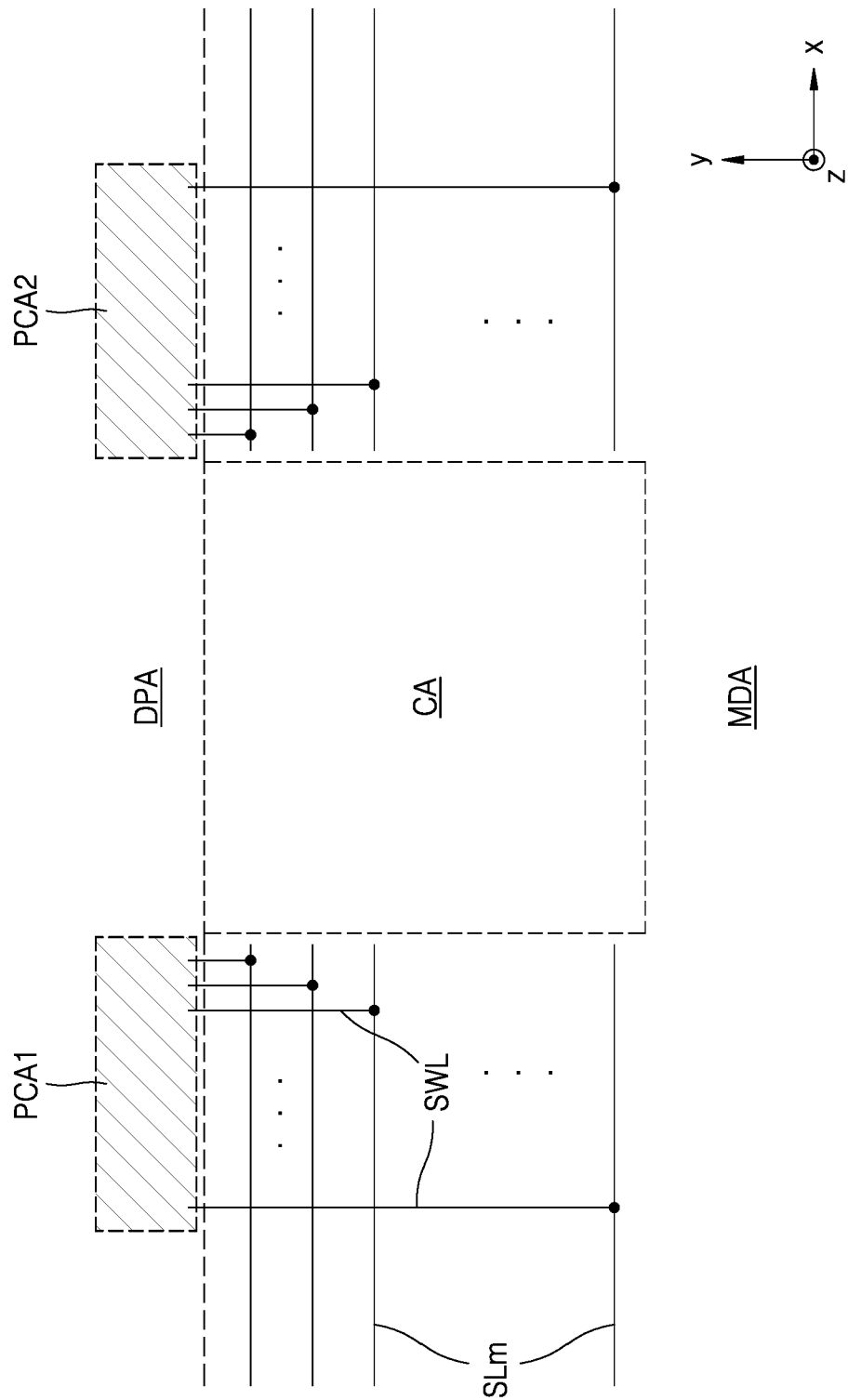
FIG. 9 is a schematic plan layout diagram illustrating signal lines arranged in a partial area of a display panel according to some embodiments.

FIGS. 8 and 9 are schematic plan layout diagrams illustrating signal lines arranged in a partial area of a display panel according to some embodiments. For example, FIG. 8 illustrates a scan line arranged at a portion of a component area CA, a main display area MDA therearound, and a peripheral area DPA.

Referring to FIG. 8, a first pixel circuit unit PCA1 and a second pixel circuit unit PCA2 including auxiliary pixel circuits may be arranged to be spaced apart from each other in the peripheral area DPA.

A main scan line SLm may be connected to a main pixel circuit to transmit a scan signal to the main pixel circuit. The main scan line SLm may extend in the x direction and may be disconnected with the component area CA therebetween. That is, the main scan line SLm arranged on the right side of the component area CA and the main scan line SLm arranged on the left side of the component area CA may be arranged to be spaced apart from each other.

According to some embodiments, some of the main scan lines SLm may be connected to a scan connection line SWL. For example, the main scan lines SLm arranged around the component area CA may be connected to the scan connection line SWL. The scan connection line SWL may be branched from the main scan line SLm and electrically connected to the auxiliary pixel circuit. Accordingly, the same scan signal as the scan signal transmitted to some main pixel circuits may be transmitted to some auxiliary pixel circuits.

The scan connection line SWL may be directly connected to the auxiliary pixel circuit PCa (see FIG. 5) arranged in the first pixel circuit unit PCA1 or the second pixel circuit unit PCA2 or may be connected to an auxiliary scan line arranged in the first pixel circuit unit PCA1 or the second pixel circuit unit PCA2, to transmit a scan signal thereto.

The scan connection line SWL may extend in a direction intersecting with the main scan line SLm. For example, the scan connection line SWL may extend in the y direction. The scan connection line SWL may be provided as a plurality of scan connection lines SWL, and the plurality of scan connection lines SWL may be respectively connected to a plurality of main scan lines SLm.

As illustrated in FIG. 8, the scan connection line SWL may be connected to the main scan line SLm arranged farther from the peripheral area DPA as it is more adjacent to the component area CA. That is, the scan connection line SWL arranged more adjacent to the component area CA may be longer. However, embodiments according to the disclosure are not limited thereto.

As illustrated in FIG. 9, the scan connection line SWL may be connected to the main scan line SLm arranged more adjacent to the peripheral area DPA as it is more adjacent to the component area CA. That is, the scan connection line SWL arranged more adjacent to the component area CA may be shorter.

According to some embodiments, the scan connection line SWL may not be arranged in the peripheral area DPA arranged on the right or left side of the main display area MDA but may be arranged in the main display area MDA. Accordingly, the area of the peripheral area DPA may be minimized or relatively reduced. That is, a dead space may be minimized or relatively reduced.

Figure 10:
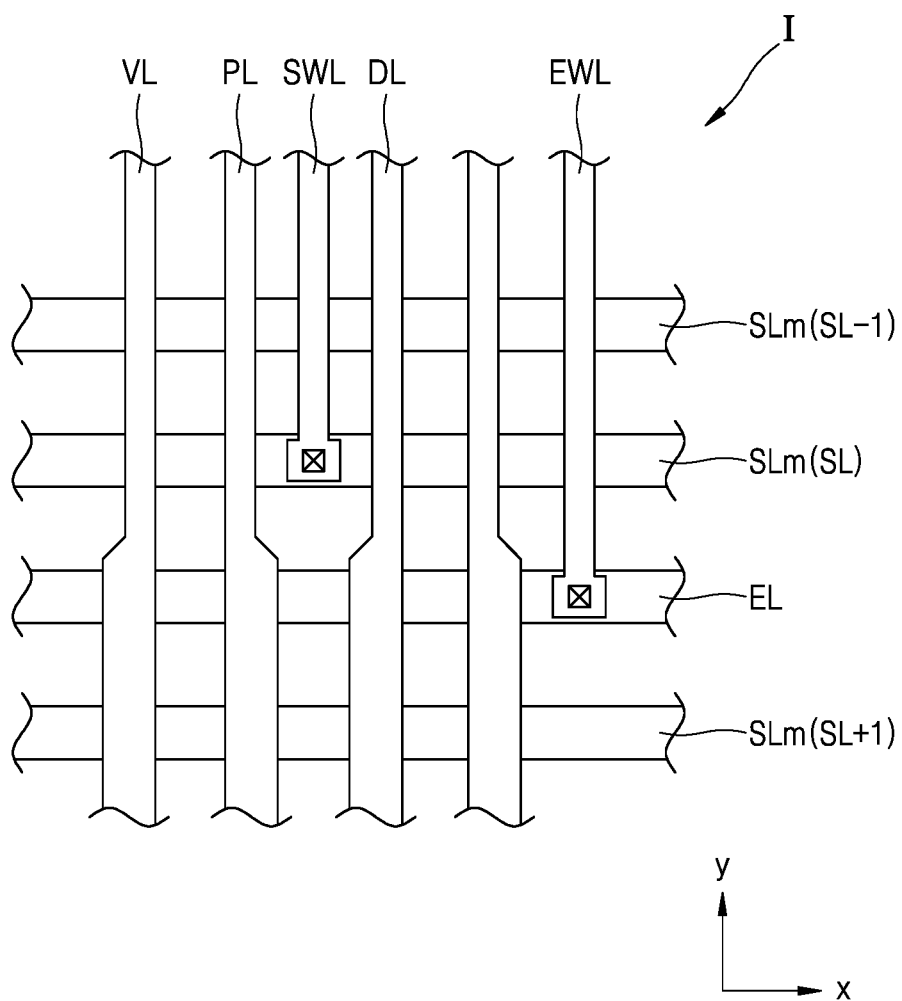
FIG. 10 is a plan layout diagram that may correspond to region I of FIG. 8 according to some embodiments, which illustrates an arrangement relationship of some lines.
Figure 11:
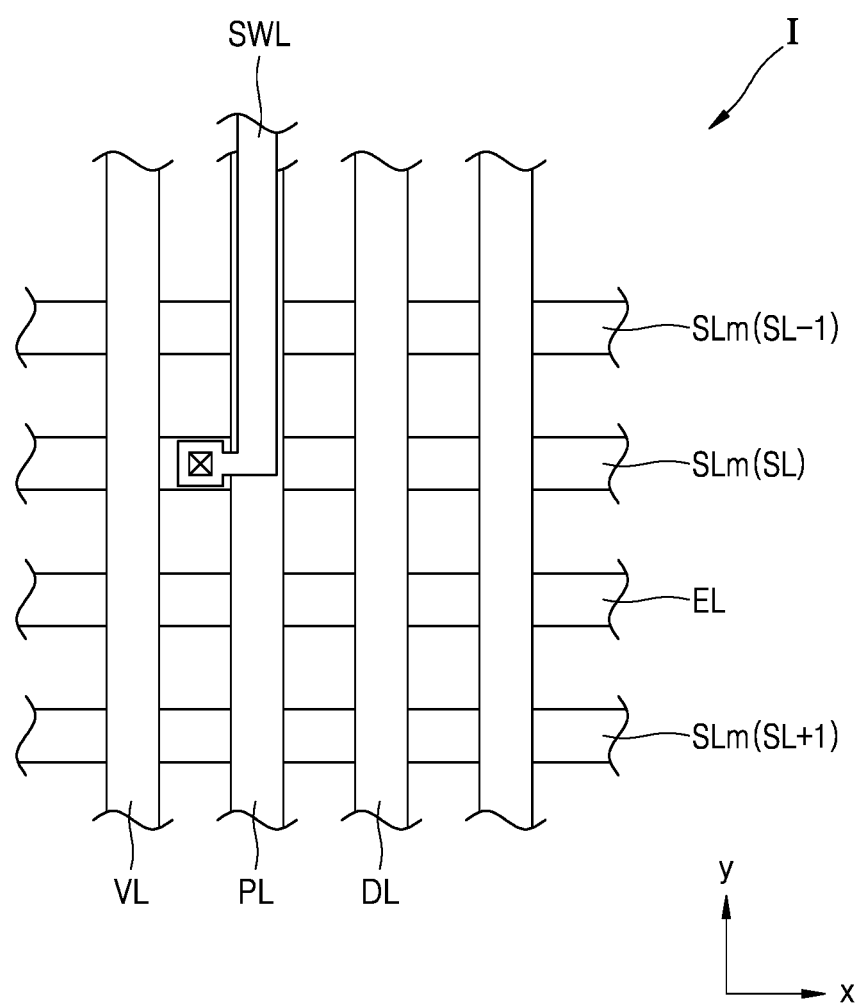
FIG. 11 is a plan layout diagram that may correspond to region I of FIG. 8 according to some embodiments, which illustrates an arrangement relationship of some lines.

FIGS. 10 and 11 are plan layout diagrams that may correspond to region I of FIG. 8, which illustrate an arrangement relationship of some lines.

Referring to FIG. 10, a main scan line SLm may include a previous scan line SL−1, a scan line SL, and a next scan line SL+1 arranged in a main display area. Also, an emission control line EL configured to transmit an emission control signal to a main pixel circuit may be arranged in the main display area. The previous scan line SL−1, the scan line SL, the next scan line SL+1, and the emission control line EL may be spaced apart from each other and extend in the x direction. The previous scan line SL−1, the scan line SL, the next scan line SL+1, and the emission control line EL may be arranged on the same layer. For example, the previous scan line SL−1, the scan line SL, the next scan line SL+1, and the emission control line EL may be arranged over the first gate insulating layer 112 (see FIG. 6) that is the same layer as the first gate electrode G1 of the main thin film transistor TFT.

A data line DL and a driving voltage line PL may be arranged on a different layer than the main scan line SLm and extend in a direction intersecting with the main scan line SLm. For example, the data line DL and the driving voltage line PL may extend in the y direction. In some embodiments, an initialization voltage line VL may also extend in the y direction. The data line DL and the driving voltage line PL may be arranged over the interlayer insulating layer 115 (see FIG. 6).

A scan connection line SWL may be arranged on the same layer as the data line DL and connected to the main scan line SLm through a contact hole. The scan connection line SWL may be arranged between the data line DL and the driving voltage line PL in the plan view. Alternatively, the scan connection line SWL may be arranged between the driving voltage line PL and the initialization voltage line VL in the plan view.

In some embodiments, the emission control line EL may be connected through a contact hole to a control connection line EWL extending in the y direction. The control connection line EWL may be connected to an auxiliary pixel circuit to transmit, to the auxiliary pixel circuit, the same emission control signal transmitted to the main pixel circuit.

In FIG. 10, the scan connection line SWL is arranged to be spaced apart from the data line DL on the same layer as the data line DL; however, embodiments according to the disclosure are not limited thereto. Referring to FIG. 11, the scan connection line SWL may be arranged on a different layer than the data line DL and the driving voltage line PL and arranged to overlap the driving voltage line PL. As the scan connection line SWL overlaps the driving voltage line PL configured to transmit a constant voltage, the influence of a signal from the scan connection line SWL on the main pixel circuit may be minimized or relatively reduced.

The scan connection line SWL may be arranged over the driving voltage line PL with the driving voltage line PL and an insulating layer therebetween. For example, the driving voltage line PL may be arranged over the interlayer insulating layer 115 (see FIG. 6), and the scan connection line SWL may be arranged over the first planarization layer 117a. Also, the main scan line SLm may be arranged over the first gate insulating layer 112 (see FIG. 6). In this case, the scan connection line SWL may be connected to the main scan line SLm through a contact hole penetrating the first planarization layer 117a, the interlayer insulating layer 115, and the second gate insulating layer 113.

Figure 12:
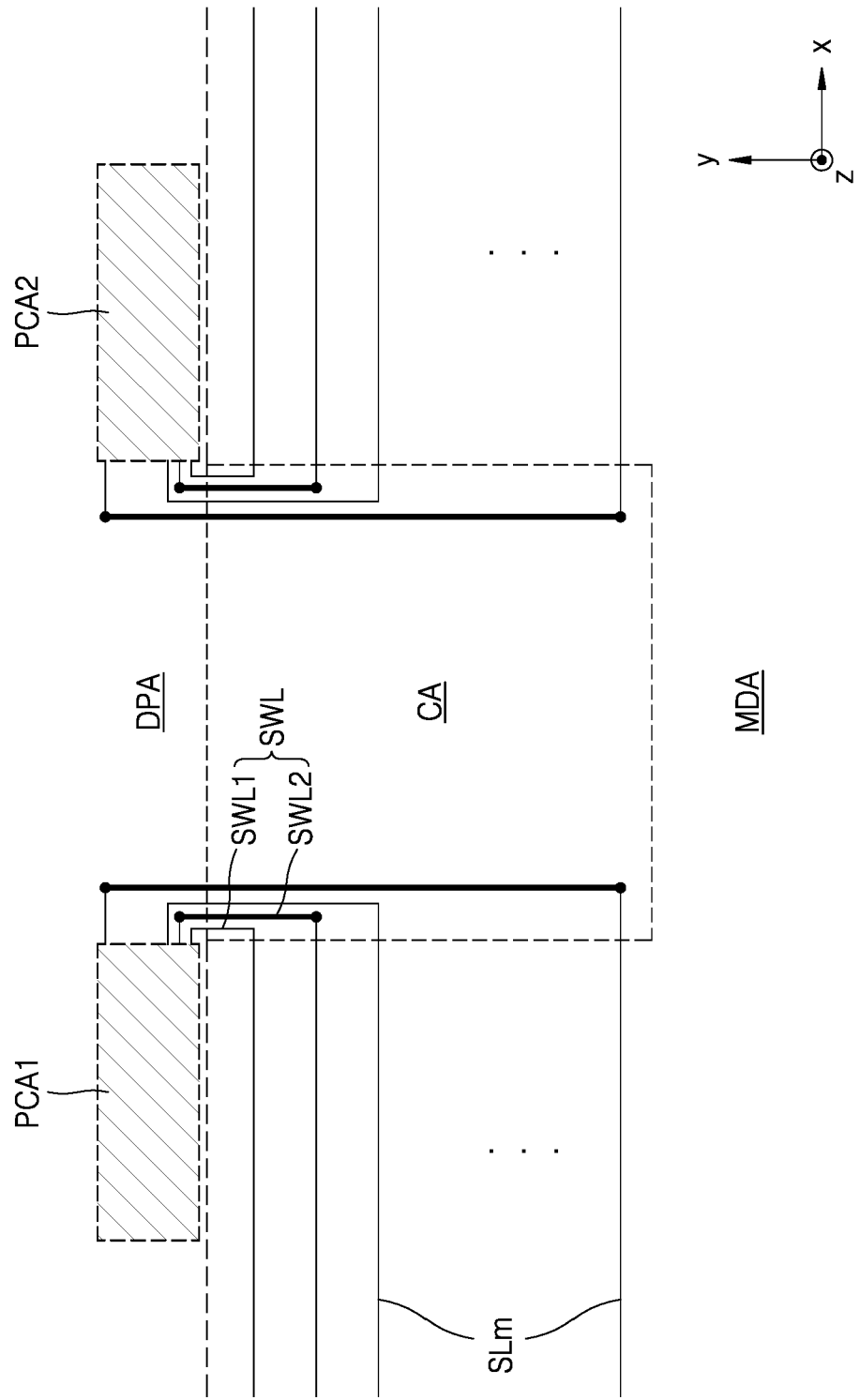
FIG. 12 is a schematic plan layout diagram illustrating signal lines arranged in a partial area of a display panel according to some embodiments.
Figure 13:
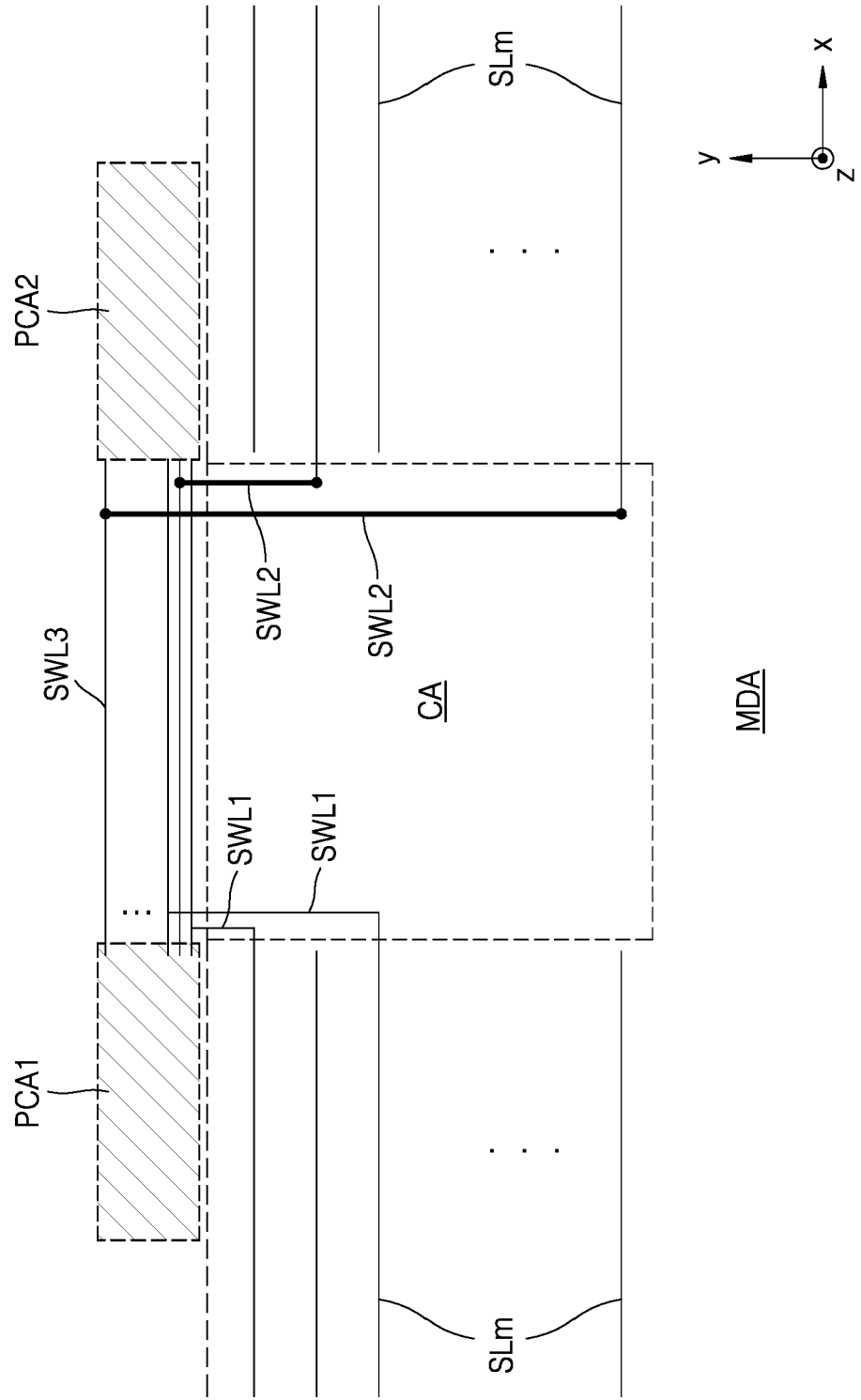
FIG. 13 is a schematic plan layout diagram illustrating signal lines arranged in a partial area of a display panel according to some embodiments.

FIGS. 12 and 13 are schematic plan layout diagrams illustrating signal lines arranged in a partial area of a display panel according to some embodiments. For example, FIGS. 12 and 13 illustrate a scan line arranged at a portion of a component area CA, a main display area MDA therearound, and a peripheral area DPA.

Referring to FIG. 12, a first pixel circuit unit PCA1 and a second pixel circuit unit PCA2 including auxiliary pixel circuits may be arranged to be spaced apart from each other in the peripheral area DPA.

A main scan line SLm may be connected to a main pixel circuit to transmit a scan signal to the main pixel circuit. The main scan line SLm may extend in the x direction and may be disconnected with the component area CA therebetween. That is, the main scan line SLm arranged on the right side of the component area CA and the main scan line SLm arranged on the left side of the component area CA may be arranged to be spaced apart from each other.

According to some embodiments, a scan connection line SWL may be arranged on one side of the component area CA. Alternatively, the scan connection line SWL may be arranged at the boundary between the main display area MDA and the component area CA.

In some embodiments, the scan connection line SWL may include a first scan connection line SWL1 and a second scan connection line SWL2 arranged on different layers. As the first scan connection line SWL1 and the second scan connection line SWL2 are arranged on different layers, because the gap between the first scan connection line SWL1 and the second scan connection line SWL2 may be minimized or the first scan connection line SWL1 and the second scan connection line SWL2 may be arranged to overlap each other, the area according to the arrangement of the scan connection line SWL may be minimized.

In some embodiments, the first scan connection line SWL1 may be integrally provided on the same layer as the main scan line SLm. The second scan connection line SWL2 may be arranged on an upper layer than the first scan connection line SWL1. However, embodiments according to the disclosure are not limited thereto. Both the first scan connection line SWL1 and the second scan connection line SWL2 may be arranged on a different layer than the main scan line SLm. The scan connection line SWL may extend in a direction intersecting with the main scan line SLm.

Some of the main scan lines SLm may be connected to the first scan connection line SWL1, and some others may be connected to the second scan connection line SWL2. When the main scan line SLm connected to the first scan connection line SWL1 is integrally provided with the first scan connection line SWL1, it may be said that the main scan line SLm extends in the x direction in the main display area MDA and extends in the y direction in the component area CA.

The main scan line SLm connected to the second scan connection line SWL2 may be connected to the second scan connection line SWL2 through a contact hole. The second scan connection line SWL2 may be arranged on various layers such as over the second gate insulating layer 113 (see FIG. 6) and over the interlayer insulating layer 115.

The scan connection line SWL may be branched from the main scan line SLm and electrically connected to the auxiliary pixel circuit. Accordingly, the same scan signal as the scan signal transmitted to some main pixel circuits may be transmitted to some auxiliary pixel circuits.

The scan connection line SWL may be directly connected to the auxiliary pixel circuit PCa (see FIG. 5) arranged in the first pixel circuit unit PCA1 or the second pixel circuit unit PCA2 or may be connected to an auxiliary scan line arranged in the first pixel circuit unit PCA1 or the second pixel circuit unit PCA2, to transmit a scan signal thereto.

Although FIG. 12 illustrates that the main scan lines SLm arranged in the same row on the left and right sides of the component area CA are all connected to the scan connection line SWL, embodiments according to the disclosure are not limited thereto. As illustrated in FIG. 13, one of the main scan lines SLm arranged in the same row on the left and right sides of the component area CA may not be connected to the scan connection line SWL.

Referring to FIG. 13, among the main scan lines SLm arranged on the left side of the component area CA, the main scan line SLm in the odd-numbered row may be connected to the first scan connection line SWL1, and the main scan line SLm in the even-numbered row may not be connected to the scan connection line and may be provided with an end disconnected.

On the other hand, among the main scan lines SLm arranged on the right side of the component area CA, the main scan line SLm in the even-numbered row may be connected to the second scan connection line SWL2, and the main scan line SLm in the odd-numbered row may not be connected to the scan connection line and may be provided with an end disconnected.

The first scan connection line SWL1 and the second scan connection line SWL2 may be arranged outside the component area CA or between the main display area MDA and the component area CA and may extend in the y direction.

Moreover, some embodiments may further include a third scan connection line SWL3 arranged in the peripheral area DPA and connecting the first scan connection line SWL1 to the second scan connection line SWL2. That is, the third scan connection line SWL3 may connect the first pixel circuit unit PCA1 to the second pixel circuit unit PCA2.

As the third scan connection line SWL3 is arranged, because the number of first scan connection lines SWL1 and second scan connection lines SWL2 connected to the main scan line SLm may be reduced, the area required for the arrangement of the first scan connection line SWL1 and the second scan connection line SWL2 may be minimized.

As described above, in the display panel and the display apparatus according to the present embodiments, because the pixel circuit is not arranged in the component area, a wider transmission area may be secured to improve the transmittance thereof.

However, the scope of embodiments according to the disclosure is not limited to these effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and their equivalents.

What is claimed is:

1. A display panel comprising:
   a substrate including a main display area, a component area, and a peripheral area;
   a plurality of main subpixels in the main display area over the substrate and a plurality of main pixel circuits respectively connected to the plurality of main subpixels;
   a plurality of auxiliary subpixels in the component area over the substrate, the auxiliary subpixels being configured to display an auxiliary image in the component area, the auxiliary image having a resolution different from a resolution of an image displayed in the main display area, and each auxiliary subpixel of the plurality of the auxiliary subpixels comprises a light emitting diode;
   a first pixel circuit unit and a second pixel circuit unit in the peripheral area over the substrate and including a plurality of auxiliary pixel circuits;
   a plurality of main scan lines connected to the plurality of main pixel circuits in the main display area and extending in a first direction and a plurality of main data lines extending in a second direction intersecting with the first direction; and
   a plurality of scan connection lines branched from some of the plurality of main scan lines in the second direction and connected to the plurality of auxiliary pixel circuits,
   wherein the plurality of scan connection lines are in the main display area or between the main display area and the component area.

2. The display panel of claim 1, wherein, among the plurality of scan connection lines, a length of a scan connection line adjacent to the component area is greatest.

3. The display panel of claim 1, wherein, among the plurality of scan connection lines, a length of a scan connection line adjacent to the component area is smallest.

4. The display panel of claim 1, wherein the plurality of scan connection lines are on a same layer as the plurality of main data lines.

5. The display panel of claim 1, further comprising a plurality of driving voltage lines connected to the plurality of main pixel circuits in the main display area and extending in a y direction,
   wherein each of the plurality of scan connection lines at least partially overlaps each of the plurality of driving voltage lines.

6. The display panel of claim 1, wherein the plurality of scan connection lines include a first scan connection line and a second scan connection line on different layers.

7. The display panel of claim 6, wherein the first scan connection line is on a same layer as the plurality of main scan lines.

8. The display panel of claim 1, wherein the plurality of main scan lines include a first main scan line and a second main scan line in a same row with the component area therebetween, wherein the first main scan line is connected to one of the plurality of scan connection lines, and the second main scan line is not connected to the plurality of scan connection lines.

9. The display panel of claim 1, further comprising a plurality of connection lines respectively connecting the plurality of auxiliary subpixels to the plurality of auxiliary pixel circuits,
wherein the plurality of connection lines include a transparent conductive material.

10. The display panel of claim 9, further comprising a plurality of additional connection lines connecting the plurality of connection lines to the plurality of auxiliary pixel circuits, wherein the plurality of additional connection lines include a different material than the plurality of connection lines.

11. A display apparatus comprising:
a display panel comprising a main display area including main subpixels, a component area including auxiliary subpixels, and a peripheral area; and
a component under the display panel at the component area, the display panel comprising:
a substrate;
a plurality of main subpixels in the main display area over the substrate and a plurality of main pixel circuits respectively connected to the plurality of main subpixels;
a plurality of auxiliary subpixels in the component area over the substrate, the auxiliary subpixels being configured to display an auxiliary image in the component area, the auxiliary image having a resolution different from a resolution of an image displayed in the main display area, and each auxiliary subpixel of the plurality of the auxiliary subpixels comprises a light emitting diode;
a first pixel circuit unit and a second pixel circuit unit in the peripheral area over the substrate and including a plurality of auxiliary pixel circuits;
a plurality of main scan lines connected to the plurality of main pixel circuits in the main display area and extending in a first direction and a plurality of main data lines extending in a second direction intersecting with the first direction; and
a plurality of scan connection lines branched from some of the plurality of main scan lines in the second direction and connected to the plurality of auxiliary pixel circuits,
wherein the plurality of scan connection lines are in the main display area or between the main display area and the component area.

12. The display apparatus of claim 11, wherein, among the plurality of scan connection lines, a length of a scan connection line adjacent to the component area is greatest.

13. The display apparatus of claim 11, wherein, among the plurality of scan connection lines, a length of a scan connection line adjacent to the component area is smallest.

14. The display apparatus of claim 11, wherein the plurality of scan connection lines are on a same layer as the plurality of main data lines.

15. The display apparatus of claim 11, further comprising a plurality of driving voltage lines connected to the plurality of main pixel circuits in the main display area and extending in a y direction,
wherein each of the plurality of scan connection lines at least partially overlaps each of the plurality of driving voltage lines.

16. The display apparatus of claim 11, wherein the plurality of scan connection lines include a first scan connection line and a second scan connection line on different layers.

17. The display apparatus of claim 16, wherein the first scan connection line is on a same layer as the plurality of main scan lines.

18. The display apparatus of claim 11, wherein the plurality of main scan lines include a first main scan line and a second main scan line in a same row with the component area therebetween, wherein the first main scan line is connected to one of the plurality of scan connection lines, and the second main scan line is not connected to the plurality of scan connection lines.

19. The display apparatus of claim 11, further comprising a plurality of connection lines respectively connecting the plurality of auxiliary subpixels to the plurality of auxiliary pixel circuits,
wherein the plurality of connection lines include a transparent conductive material.

20. The display apparatus of claim 19, further comprising a plurality of additional connection lines connecting the plurality of connection lines to the plurality of auxiliary pixel circuits, wherein the plurality of additional connection lines include a different material than the plurality of connection lines.

* * * * *